United States Patent
Roper et al.

(10) Patent No.: US 9,797,661 B1
(45) Date of Patent: Oct. 24, 2017

(54) METHOD OF FORMING A LIGHTWEIGHT SANDWICH PANEL HEAT PIPE

(71) Applicant: HRL LABORATORIES, LLC, Malibu, CA (US)

(72) Inventors: Christopher S. Roper, Malibu, CA (US); Alan J. Jacobsen, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 776 days.

(21) Appl. No.: 14/042,039

(22) Filed: Sep. 30, 2013

Related U.S. Application Data

(62) Division of application No. 12/383,378, filed on Mar. 23, 2009, now Pat. No. 8,579,018.

(51) Int. Cl.
*F28D 15/04* (2006.01)
*B23P 15/26* (2006.01)
*F28F 3/00* (2006.01)

(52) U.S. Cl.
CPC .............. *F28D 15/04* (2013.01); *B23P 15/26* (2013.01); *F28D 15/046* (2013.01); *F28F 3/00* (2013.01); *Y10T 29/49353* (2015.01)

(58) Field of Classification Search
CPC ... F28D 15/04; B23P 15/26; F28F 3/00; F28F 1/42; F28F 1/422; E04C 2/34; E04C 2/3405; E04C 2002/3488; E04C 2002/3455; E04C 2002/345; E04C 2002/3472; Y10T 428/236; Y10T 428/24149; Y10T 428/1234; Y10T 29/49361–29/49384; Y10T 29/49353
See application file for complete search history.

(56) References Cited

U.S. PATENT DOCUMENTS 3,984,861 A   10/1976   Kessler, Jr.
4,602,679 A   7/1986   Edelstein et al.
(Continued)

OTHER PUBLICATIONS

Carbajal, et al., "Thermal response of a flat heat pipe sandwich structure to a localized heat flux", International Journal of Heat and Mass Transfer, No. 49, (2006), pp. 4070-4081.
(Continued)

*Primary Examiner* — Sarang Afzali
(74) *Attorney, Agent, or Firm* — Lewis Roca Rothgerber Christie, LLP

(57) ABSTRACT

A method for creating a sandwich panel heat pipe is disclosed. A three-dimensional ordered micro-truss core comprising a plurality of periodically disposed unit cells comprising an open-cellular microstructure and a free space defined by the open-cellular microstructure wherein the core comprises a vapor region and a liquid region separated by a mesh structure. A first face sheet and a second face sheet are stacked with the three-dimensional ordered micro-truss core to form a heat pipe assembly with the mesh structure in the three-dimensional ordered micro-truss core being planar and substantially parallel to the first face sheet and the second face sheet. The first and second face sheets are bonded to enclose the three-dimensional ordered micro-truss core wherein the free space of the three-dimensional ordered micro-truss core between the first and second face sheets is filled with a working fluid through an inlet and the inlet is sealed.

7 Claims, 19 Drawing Sheets

(56) References Cited

U.S. PATENT DOCUMENTS

| | | | |
|---|---|---|---|
| 5,248,079 | A | 9/1993 | Li |
| 6,274,288 | B1* | 8/2001 | Kewitsch .............. B82Y 20/00 |
| | | | 430/270.14 |
| 6,293,332 | B2 | 9/2001 | Li |
| 6,868,898 | B2 | 3/2005 | Chau et al. |
| 6,888,720 | B2 | 5/2005 | Pfister et al. |
| 7,382,959 | B1 | 6/2008 | Jacobsen |
| 7,401,643 | B2 | 7/2008 | Queheillalt et al. |
| 7,687,132 | B1 | 3/2010 | Gross et al. |
| 8,268,510 | B2* | 9/2012 | Rock .................. H01M 8/0232 |
| | | | 427/115 |
| 2004/0123980 | A1* | 7/2004 | Queheillalt .......... C23C 14/046 |
| | | | 165/133 |
| 2005/0202206 | A1 | 9/2005 | Wadley et al. |
| 2006/0162907 | A1 | 7/2006 | Wu et al. |
| 2006/0163319 | A1 | 7/2006 | Ervin et al. |
| 2007/0068654 | A1 | 3/2007 | Chang |
| 2007/0102140 | A1 | 5/2007 | Tuma et al. |
| 2007/0107875 | A1 | 5/2007 | Lee et al. |
| 2007/0163755 | A1 | 7/2007 | Kim et al. |
| 2010/0157535 | A1 | 6/2010 | Oniki et al. |
| 2010/0159398 | A1 | 6/2010 | Rock et al. |
| 2010/0236759 | A1* | 9/2010 | Wadley .................... E04C 2/34 |
| | | | 165/104.19 |

OTHER PUBLICATIONS

Lu, et al., "Active cooling by metallic sandwich structures with periodic cores", Progress in Materials Science, No. 50, (2005), pp. 789-815.

Monro, Tanya M., "Topical review, Catching light in its own trap", Journal of Modern Optics, 2001, vol. 48, No. 2, pp. 191-238.

Queheillalt, et al., "A multifunctional heat pipe sandwich panel structure", International Journal of Heat and Mass Transfer, No. 51, (2008), pp. 312-326.

Tian, et al., "The effects of topology upon fluid-flow and heat-transfer within cellular copper structures", International Journal of Heat and Mass Transfer, Mar. 6, 2004, 16 pages.

* cited by examiner

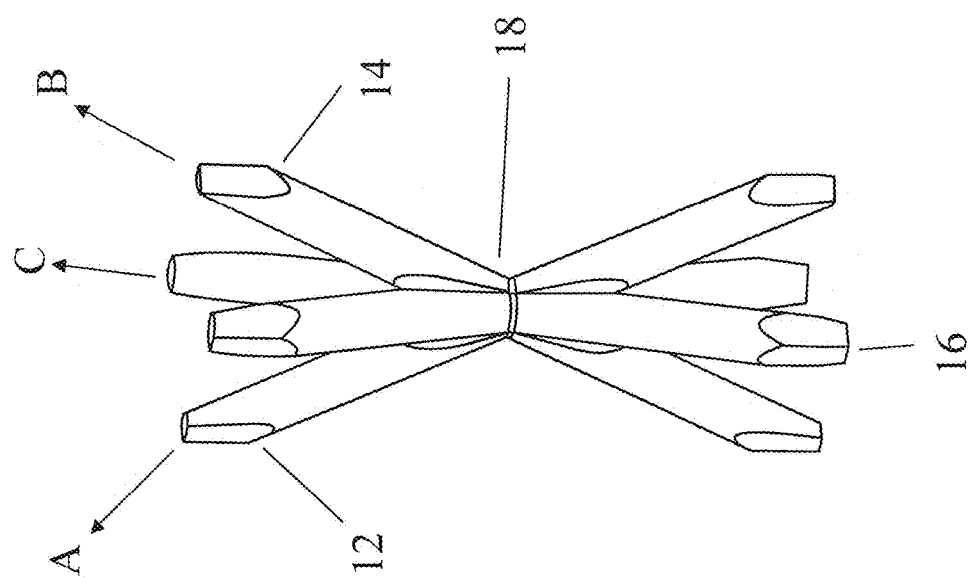
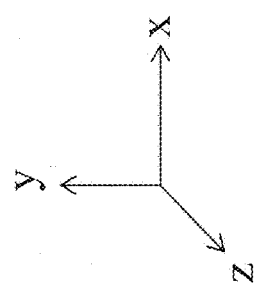
FIG. 1

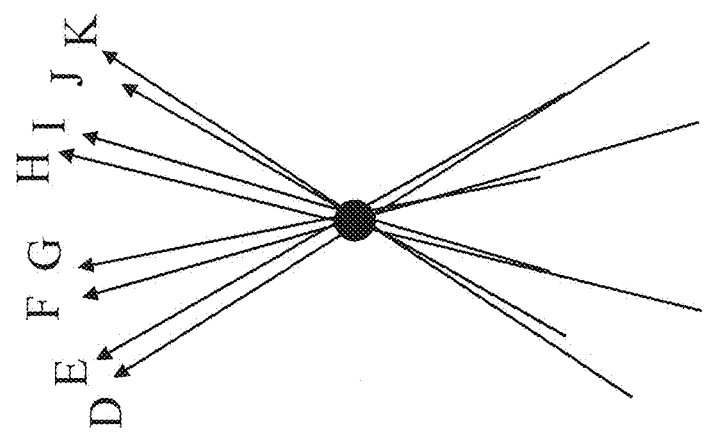

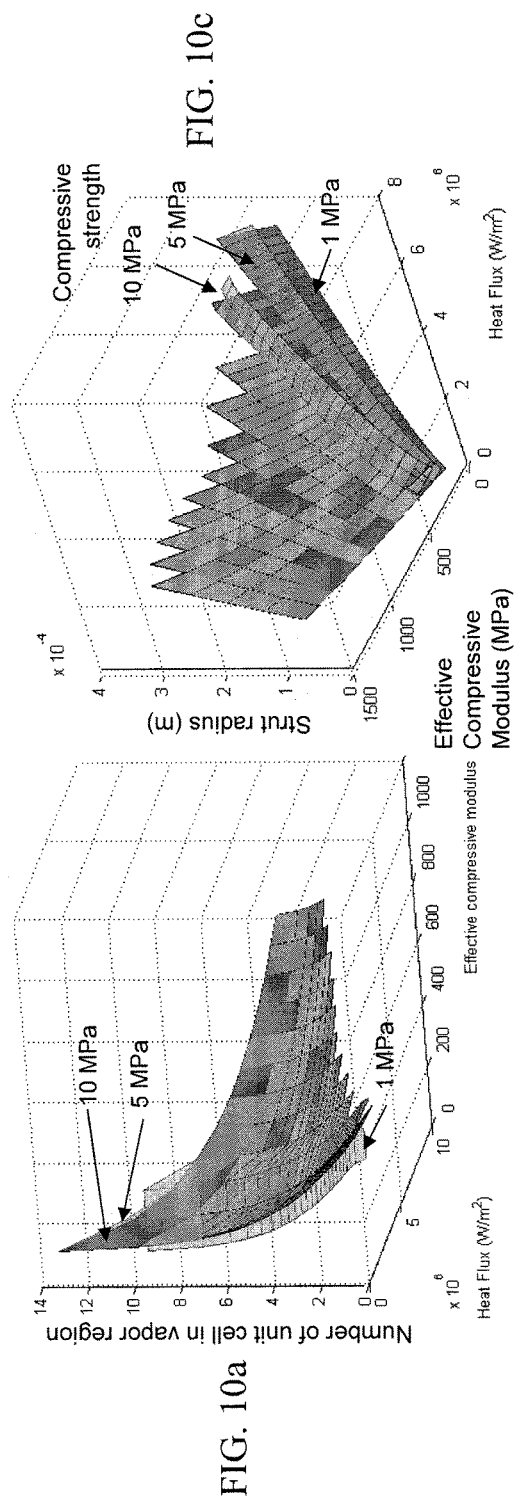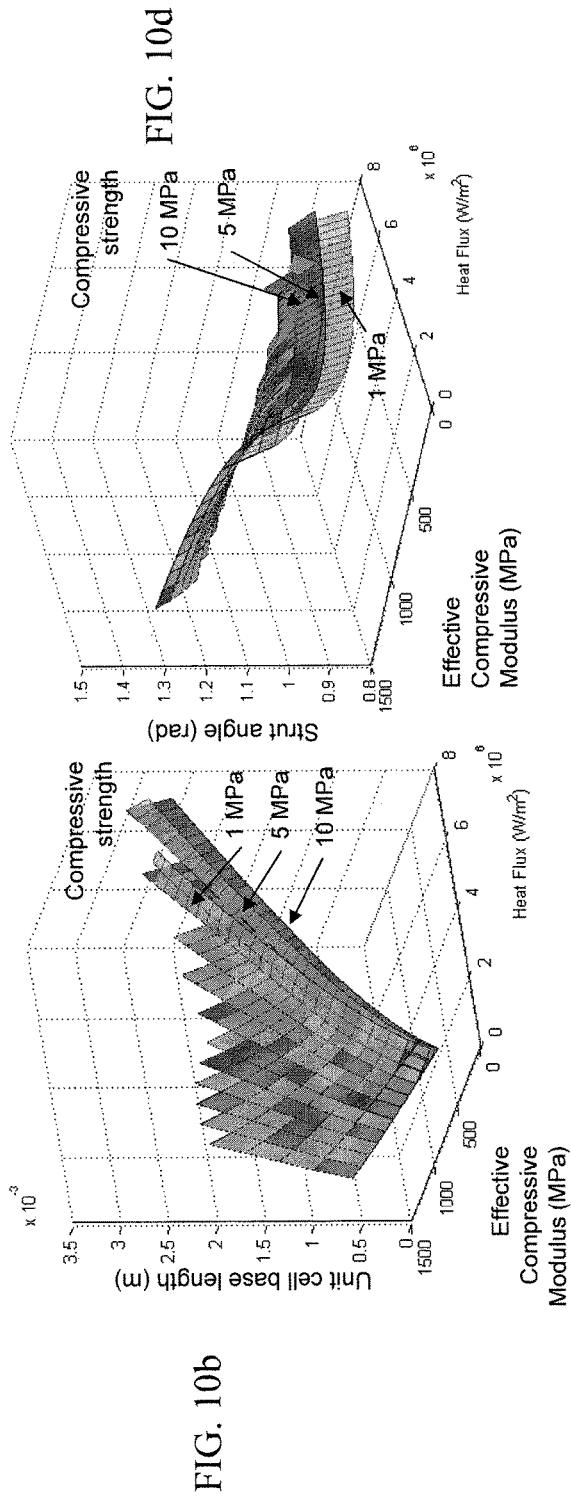
FIG. 10a
FIG. 10b
FIG. 10c
FIG. 10d

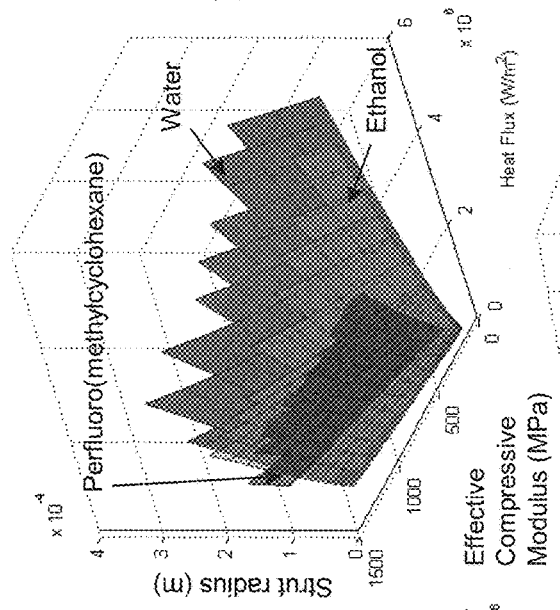
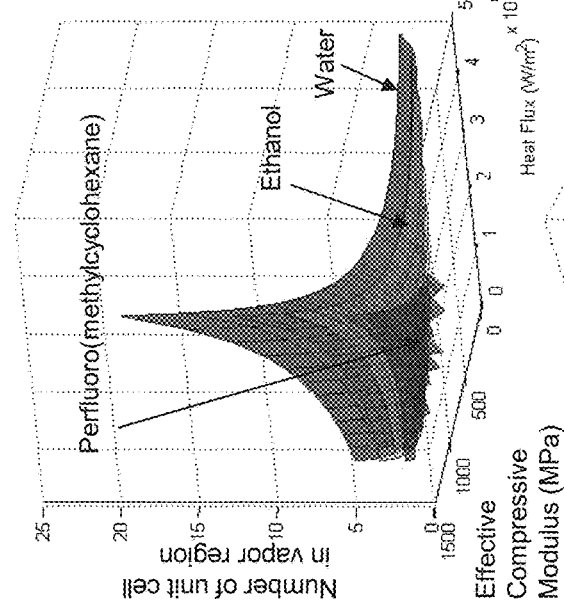
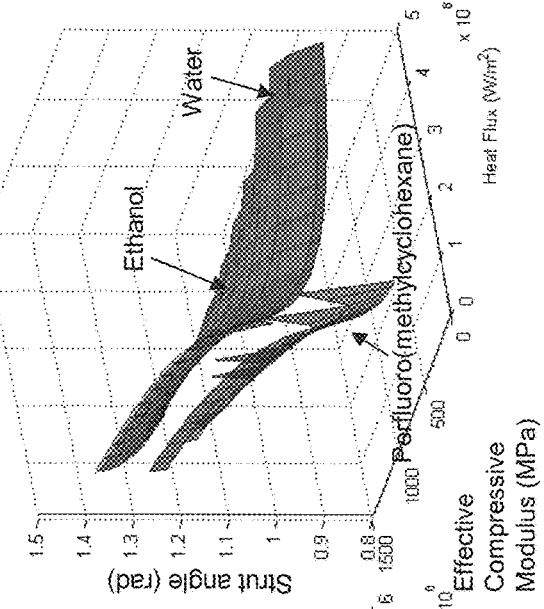
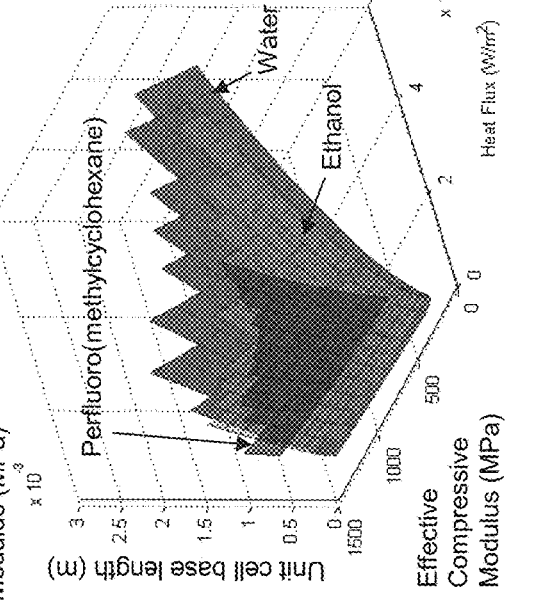
FIG. 12a
FIG. 12b
FIG. 12c
FIG. 12d

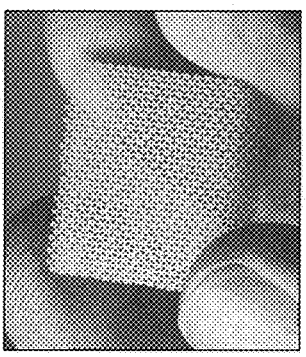
Micro-Truss
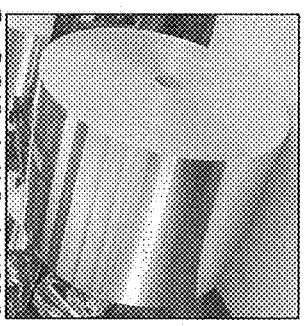
Metal Foil Face Sheets
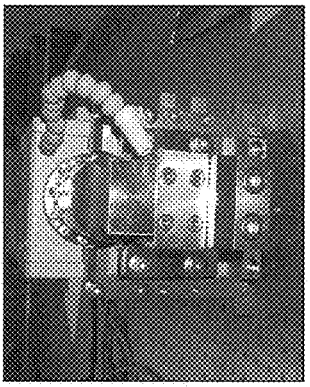
Ultrasonic Metal Welding
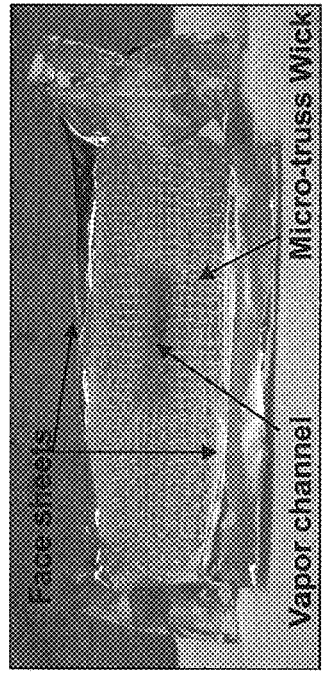
Sealed micro-truss core sandwich
Cut away view
FIG. 16

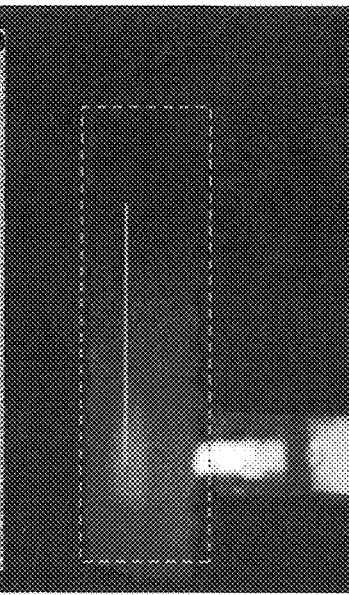
FIG. 19a
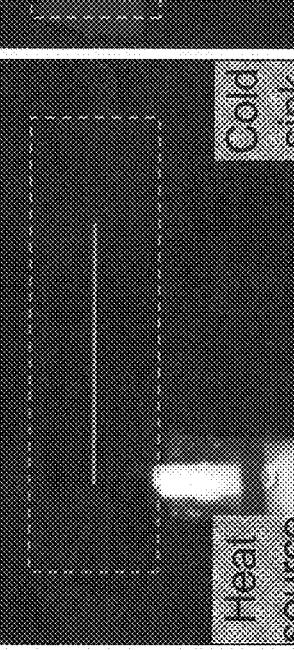
FIG. 19b
FIG. 19c
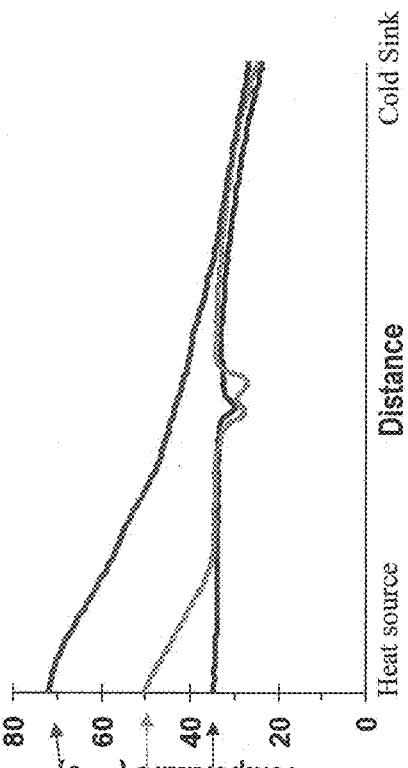
FIG. 19d

METHOD OF FORMING A LIGHTWEIGHT SANDWICH PANEL HEAT PIPE

CROSS-REFERENCE TO RELATED APPLICATION

This application is a divisional of U.S. patent application Ser. No. 12/383,378, filed Mar. 23, 2009, entitled "LIGHTWEIGHT SANDWICH PANEL HEAT PIPE," the entire contents of which are incorporated herein by reference.

FIELD OF THE INVENTION

The present invention relates to a heat pipe and a method of creating the same, and more particularly, to a lightweight sandwich panel heat pipe and a method of creating the same.

BACKGROUND OF THE INVENTION

A heat pipe is a heat transfer mechanism that can transfer a large amount of heat with a very small difference in temperature between its hot portion (or higher temperature region) and its cold portion (or lower temperature region). Inside a heat pipe, at the hot portion, a working fluid is evaporated into a vapor, and the vapor flows through a vapor region within the heat pipe and condenses on the cold portion into a liquid. The liquid is then moved through a liquid region within the heat pipe (e.g., by gravity and/or capillary action) back to the hot portion to be evaporated again to repeat the heat transfer cycle. Because heat pipes contain no mechanical moving parts, it typically requires very little maintenance. In addition, as a heat transfer mechanism, a heat pipe has much higher efficiency in transferring heat and is a much better heat conductor than an equivalent solid metal block (or pipe).

In more detail, a typical heat pipe is composed of a sealed housing (or pipe) made of a material with high thermal conductivity such as copper or aluminum. The sealed pipe is evacuated to form a vacuum, and then a portion of the pipe is filled with a working fluid (or coolant). Due to the partial vacuum that is near or below the vapor pressure of the fluid, some of the fluid will be in the liquid phase and some will be in the gas phase.

Inside the pipe's walls, a wick structure may be included to exert a capillary pressure on the liquid phase of the working fluid to wick it back to the hot portion. The typical wick structure may be formed with a foam having random cell configurations or a honeycomb structure. As such, it is difficult or even impossible to fabricate high aspect ratio thin diameter pores with porosity of the desired dimensions. It addition, it is difficult to design a heat pipe that can have both high structural performance as well as high thermal performance.

As such, there is a need for a heat pipe that can be easily manufactured to have high aspect ratio small diameter pores with porosity of the desired dimensions, designed for both high structural performance as well as high thermal performance, and be tailored for a variety of applications.

SUMMARY OF THE INVENTION

Aspects of embodiments of the present invention are directed towards a specifically structural heat pipe that can be easily manufactured to have high aspect ratio thin diameter pores with porosity of the desired dimensions, designed for both high structural performance as well as high thermal performance, and/or be tailored for a variety of applications.

Aspects of embodiments of the present invention are directed toward a set of designs for the fabrication of heat pipes which have high thermal conductivity, low density, and tailored mechanical properties (e.g. stiffness and strength). Certain aspects of embodiments of the invention also provide sets of parameters for each of the set of designs. Furthermore, certain aspects of embodiments of the invention provide specifically structural heat pipe designs which decouple high capillary pressure from increased frictional pressure losses.

An embodiment of the present invention creates a heat pipe composed of lightweight multifunctional materials for applications with combined structural and thermal requirements. Here, the materials have a set of material properties (density, compressive modulus, compressive strength, and maximum heat flux) that can be designed to provide the desired structural and thermal characteristics.

More specifically, an embodiment of the present invention provides a sandwich panel heat pipe for transferring heat between a higher temperature region and a lower temperature region. The sandwich panel heat pipe includes: a first face sheet; a second face sheet; a three-dimensional ordered open-cellular micro-truss core between the first face sheet and the second face sheet; and a working fluid in the ordered open-cellular micro-truss core. The three-dimensional ordered open-cellular micro-truss core includes a vapor region and a liquid region, the vapor region being for transporting a vapor phase portion of the working fluid from the higher temperature region to the lower temperature region, and the liquid region being for transporting a liquid phase portion of the working fluid from the lower temperature region to the higher temperature region.

In one embodiment, the three-dimensional ordered open-cellular micro-truss core includes a three-dimensional ordered open-cellular micro-truss metal material.

In one embodiment, the three-dimensional ordered open-cellular micro-truss core includes a plurality of mechanical members having a three-dimensional order with a size scale between about 30 μm and about 5 mm to increase a surface area to volume ratio of the three-dimensional ordered open-cellular micro-truss material.

In one embodiment, the three-dimensional ordered open-cellular micro-truss core includes a plurality of mechanical members having a three-dimensional order with a size scale between about 30 μm and about 1 mm to increase a surface area to volume ratio of the three-dimensional ordered open-cellular micro-truss material.

In one embodiment, the vapor region has a unit cell size larger than that of the liquid region.

In one embodiment, the liquid region includes a first outer layer and a second outer layer, and the vapor region includes an inner layer between the first outer layer and the second outer layer. The inner layer may have a unit cell size larger than that of the first and second outer layers.

In one embodiment, the three-dimensional ordered open-cellular micro-truss core is a single layer having substantially identical unit cells with channels cut in it as the vapor region of the three-dimensional ordered open-cellular micro-truss core. The liquid region may be composed of the remaining portions of the single layer other than the channels.

In one embodiment, the sandwich panel further includes a mesh structure for separating the vapor region from the liquid region. The mesh structure may be a mesh. The mesh may be a stainless steel wire mesh.

In one embodiment, the three-dimensional ordered open-cellular micro-truss core is configurable in terms of its number of unit cells in the liquid region, its unit cell base length, its effective compressive modulus, its compressive strength, its strut radius, its strut angle, its maximum heat flux, its density, its effective thermal conductivity, its bending stiffness, and its bending strength.

In one embodiment, the three-dimensional ordered open-cellular micro-truss core includes a metal (for instance aluminum, nickel, copper, titanium, steel, stainless steel, bronze, tantalum, tungsten, rhenium, zirconium, and/or niobium), a polymer (for instance poly-thiolene), a ceramic (for instance silicon carbide, silicon nitride, and/or diamond), a glass (for instance silicon oxide), or a combination thereof.

In one embodiment, the first and second face sheets include a metal (for instance aluminum, nickel, copper, titanium, steel, stainless steel, bronze, tantalum, tungsten, rhenium, zirconium, and/or niobium), a polymer (for instance poly-thiolene), a ceramic (for instance silicon carbide, silicon nitride, and/or diamond), a glass (for instance silicon oxide), or a combination thereof.

In one embodiment, the working fluid includes helium, nitrogen, water, ammonia, acetone, toluene, hydrocarbons (for instance butane, pentane, hexane, heptane, and/or octane), fluorinated hydrocarbons (for instance perfluoro (methylcyclohexane)), an alcohol (for instance methanol, and/or ethanol), a molten metal (for instance sodium, lithium, potassium, cesium, bismuth, lead, mercury and/or silver) or a combination thereof.

In one embodiment, the three-dimensional ordered open-cellular micro-truss core includes: a plurality of first truss elements defined by a plurality of first self-propagating polymer waveguides and extending along a first direction; a plurality of second truss elements defined by a plurality of second self-propagating polymer waveguides and extending along a second direction; and a plurality of third truss elements defined by a plurality of third self-propagating polymer waveguides and extending along a third direction. The first, second, and third ordered truss elements interpenetrate each other at a plurality of nodes to form a continuous material.

In one embodiment, the three-dimensional ordered open-cellular micro-truss core includes: a first three-dimensional pattern; and a second three-dimensional pattern differing from the first three-dimensional pattern. The first and second three-dimensional patterns may have order in three dimensions. In one embodiment, the three-dimensional ordered open-cellular micro-truss core further includes: a plurality of first truss elements defined by a plurality of first self-propagating polymer waveguides of the first three-dimensional pattern and extending along a first direction; a plurality of second truss elements defined by a plurality of second self-propagating polymer waveguides of the first three-dimensional pattern and extending along a second direction; a plurality of third truss elements defined by a plurality of third self-propagating polymer waveguides of the first three-dimensional pattern and extending along a third direction; a plurality of fourth truss elements defined by a plurality of fourth self-propagating polymer waveguides of the second three-dimensional pattern and extending along a fourth direction; a plurality of fifth truss elements defined by a plurality of fifth self-propagating polymer waveguides of the second three-dimensional pattern and extending along a fifth direction; a plurality of sixth truss elements defined by a plurality of sixth self-propagating polymer waveguides of the second three-dimensional pattern and extending along a sixth direction; and an interface, wherein the first, second, and third truss elements interpenetrate each other at a plurality of first nodes to form a first continuous material, wherein the fourth, fifth, and sixth truss elements interpenetrate each other at a plurality of second nodes to form a second continuous material, and wherein the interface includes a plurality of third nodes for connecting the first continuous material to the second continuous material In one embodiment, the sandwich panel heat pipe further includes a panel edge terminator for bonding the first and second together, a first connection between the three-dimensional ordered open-cellular micro-truss core and the first face sheet, and/or a second connection between the three-dimensional ordered open-cellular micro-truss core and the second face sheet.

Another embodiment of the present invention provides a method of forming a sandwich panel heat pipe for transferring heat between a higher temperature region and a lower temperature region. The method includes: forming a three-dimensional ordered micro-truss structure defined by an open-cellular polymer micro-truss structure; forming a three-dimensional ordered micro-truss core by forming a vapor region and a liquid region into the three-dimensional ordered micro-truss structure, the vapor region being for transporting a vapor phase portion of the working fluid from the higher temperature region to the lower temperature region, and the liquid region being for transporting a liquid phase portion of the working fluid from the lower temperature region to the higher temperature region; forming a first face sheet and a second face sheet, each of the first and second face sheets has an area larger than that of the three-dimensional ordered micro-truss core; bonding the first and second face sheets along a perimeter of the heat pipe to enclose the three-dimensional ordered micro-truss core; filing the heat pipe with the working fluid though an inlet of the heat pipe; and sealing the inlet.

In one embodiment, the forming of the three-dimensional ordered micro-truss core includes: securing a volume of a photo-monomer; securing a mask between at least one collimated light source and the volume of the photo-monomer, the mask having a plurality of apertures; directing a collimated light beam from the at least one collimated light source to the mask for a period of exposure time such that a portion of the collimated light beam passes through the mask and is guided by the plurality of apertures into the photo-monomer to form a plurality of waveguides through a portion of the volume of the photo-monomer; and removing any uncured photo-monomer to leave behind an open-cellular polymer micro-truss structure having a plurality of truss elements defined by the plurality of waveguides.

In one embodiment, the vapor region is formed to have a unit cell size larger than that of the liquid region.

In one embodiment, the liquid region is formed to include a first outer layer and a second outer layer, and the vapor region is formed as an inner layer between the first outer layer and the second outer layer. The inner layer may be formed to have a unit cell size larger than that of the first and second outer layers.

In one embodiment, the three-dimensional ordered open-cellular micro-truss core is formed as a single layer having substantially identical unit cells with channels cut in it as the vapor region of the three-dimensional ordered open-cellular micro-truss core.

In one embodiment, the forming of the three-dimensional ordered micro-truss core includes forming a mesh structure to separate the vapor region from the liquid region.

In one embodiment, in the forming of the three-dimensional ordered micro-truss core, the three-dimensional ordered micro-truss core is configurable in terms of its number of unit cells in the liquid region, its unit cell base length, its effective compressive modulus, its compressive strength, its strut radius, its strut angle, its maximum heat flux, its density, its effective thermal conductivity, its bending stiffness, and its bending strength.

Another embodiment of the present invention provides a method of forming a sandwich panel heat pipe for transferring heat between a higher temperature region and a lower temperature region. The method includes: forming a three-dimensional ordered micro-truss structure defined by an open-cellular polymer micro-truss structure; forming a three-dimensional ordered micro-truss core by forming a vapor region and a liquid region into the three-dimensional ordered micro-truss structure, the vapor region being for transporting a vapor phase portion of the working fluid from the higher temperature region to the lower temperature region, and the liquid region being for transporting a liquid phase portion of the working fluid from the lower temperature region to the higher temperature region; forming a first face sheet and a second face sheet, each of the first and second face sheets has an area larger than that of the three-dimensional ordered micro-truss core; bonding the first face sheet to the three-dimensional ordered micro-truss core; bonding the second face sheet to the three-dimensional ordered micro-truss core; bonding the first and second face sheets to a panel edge terminator; filling the heat pipe with the working fluid through an inlet of the heat pipe; and sealing the inlet.

BRIEF DESCRIPTION OF THE DRAWINGS

The accompanying drawings, together with the specification, illustrate exemplary embodiments of the present invention, and, together with the description, serve to explain the principles of the present invention.

FIG. 1 is a perspective schematic view of a portion of a structure according to an embodiment of the present invention.

FIG. 6 is a perspective schematic view showing respective directions along which truss elements of a structure of an embodiment of the present invention extend.

FIGS. 10a, 10b, 10c, and 10d illustrate improved dimensions for sandwich panel heat pipe design in FIG. 7D with aluminum face sheets, polymer micro-truss core, water working fluid, and stainless steel wire 500 mesh.

FIGS. 12a, 12b, 12c, and 12d illustrate plots showing improved dimensions of structural heat pipe for varying working fluids with aluminum face sheets, polymer micro-truss core, stainless steel wire 500 mesh, and compressive strength ≥1 MPa.

FIG. 16 illustrates a method for fabricating a heat pipe composed of micro-truss core sandwich panels according to an embodiment of the present invention.

FIGS. 19a, 19b, 19c, and 19d schematically illustrate a test setup and data for deterring heat transfer characteristics of an unsealed, non-functioning heat pipe, a heat pipe in initial stage of burnout, and an functioning heat pipe according to embodiments of the present inventions.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

In the context of embodiments of the present invention, a three-dimensional ordered microstructure is referred to as an ordered three-dimensional structure at the micrometer scale. In one embodiment of the present invention, a heat pipe with a wick structure composed of a three-dimensional ordered microstructure is provided. Here, the heat pipe may be a lightweight sandwich panel heat pipe.

In one embodiment, the mechanical members of the three-dimensional ordered microstructure have a three-dimensional order that is on a size scale (i.e., distance from one node to another node) between 30 µm and 5 mm. In another embodiment, the mechanical members of the three-dimensional ordered microstructure have a three-dimensional order that is on a size scale (i.e., distance from one node to another node) between 30 µm and 1 mm.

Figure 2:
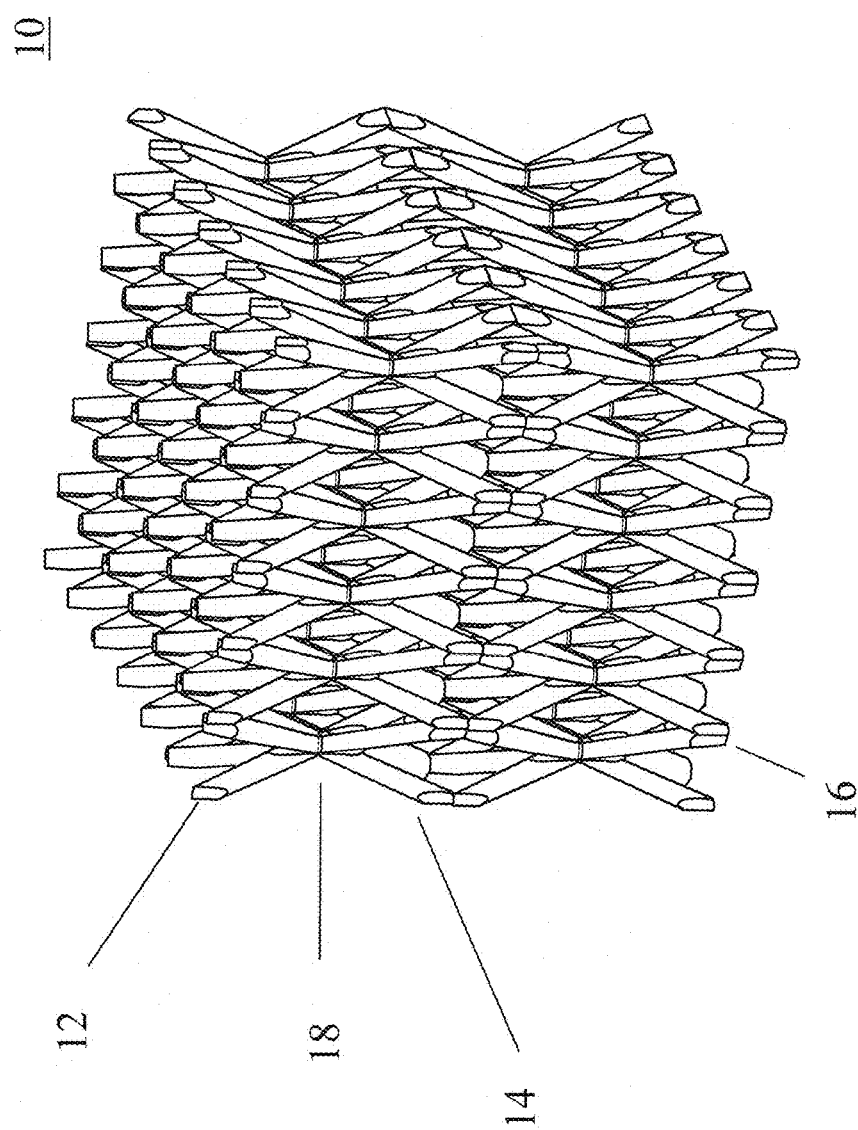
FIG. 2 is a perspective schematic view of a structure according to an embodiment of the present invention.

Referring to FIGS. 1 and 2, a three-dimensional ordered open-cellular microstructure 10 according to an embodiment of the present invention is a self-supporting structure. In one embodiment of the present invention, this three-dimensional ordered open-cellular microstructure 10 can be utilized as a three-dimensional ordered microstructure to define (or derive) the final shape and dimensions of a three-dimensional composite material. The microstructure 10 includes first truss elements 12, second truss elements 14, and third truss elements 16. The first truss elements 12 are defined by first self-propagating polymer waveguides and extend along a first direction A. The second truss elements 14 are defined by second self-propagating polymer waveguides and extend along a second direction B. The third truss elements 16 are defined by third self-propagating polymer waveguides and extend along a third direction C. With reference to FIGS. 1 and 2, the truss elements 12, 14, 16 interpenetrate each other at nodes 18 to form a continuous material with a three-dimensional microstructure order and having a plurality of three-dimensional ordered pores (or spaces) defined by (or between) the truss elements 12, 14, 16 and the nodes 18. Here, in one embodiment of the present invention, the three-dimensional ordered pores (or spaces) can be utilized for both high structural performance an well as high thermal performance, and/or be tailored for a variety of application.

In one embodiment, the truss elements 12, 14, 16 include a photo-polymer material. In one embodiment, the truss elements 12, 14, 16 are polymer optical waveguide truss elements.

In one embodiment, the continuous material is continuously formed such that it lacks any interior boundaries, e.g., boundaries within the interpenetrating portions of truss elements 12, 14, 16. In another embodiment, each node 18 of the microstructure 10 is formed of the continuous material.

According to one embodiment of the present invention, the microstructure 10 is formed by using a fixed light input (collimated UV light) to cure (polymerize) polymer optical waveguides, which can self-propagate in a 3D pattern. As such, the propagated polymer optical waveguides form the microstructure 10. Here, the microstructure 10 in FIG. 2 is shown to be composed of two layers of the truss elements 12, 14, 16 which interpenetrate each other at the nodes 18 stacked adjacent to one other, but the present invention is not limited to only two layers. For example, in one embodiment, three or more layers can be utilized. Also, each of the layers may be continuous for a structure with an overall thickness of one inch, and thicker layers may be built of stacked thinner layers adjacent to one other (e.g., stacked adjacent and mechanically connected to one another or stacked adjacent (and not mechanically connected to one another)).

As disclosed in Monro et al. "Topical Review Catching Light In Its Own Trap," Journal Of Modern Optics, 2001, Vol. 48, No. 2, 191-238, which is incorporated by reference herein in its entirety, some liquid polymers, referred to as photopolymers, undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a waveguide structure with approximately the same cross-sectional dimensions along its entire length.

According to one embodiment of the present invention, a mask with a two-dimensional pattern of apertures (see FIG. 3) is used to create a three-dimensional polymer microstructure (or an open-cellular polymer micro-truss structure).

Figure 3:
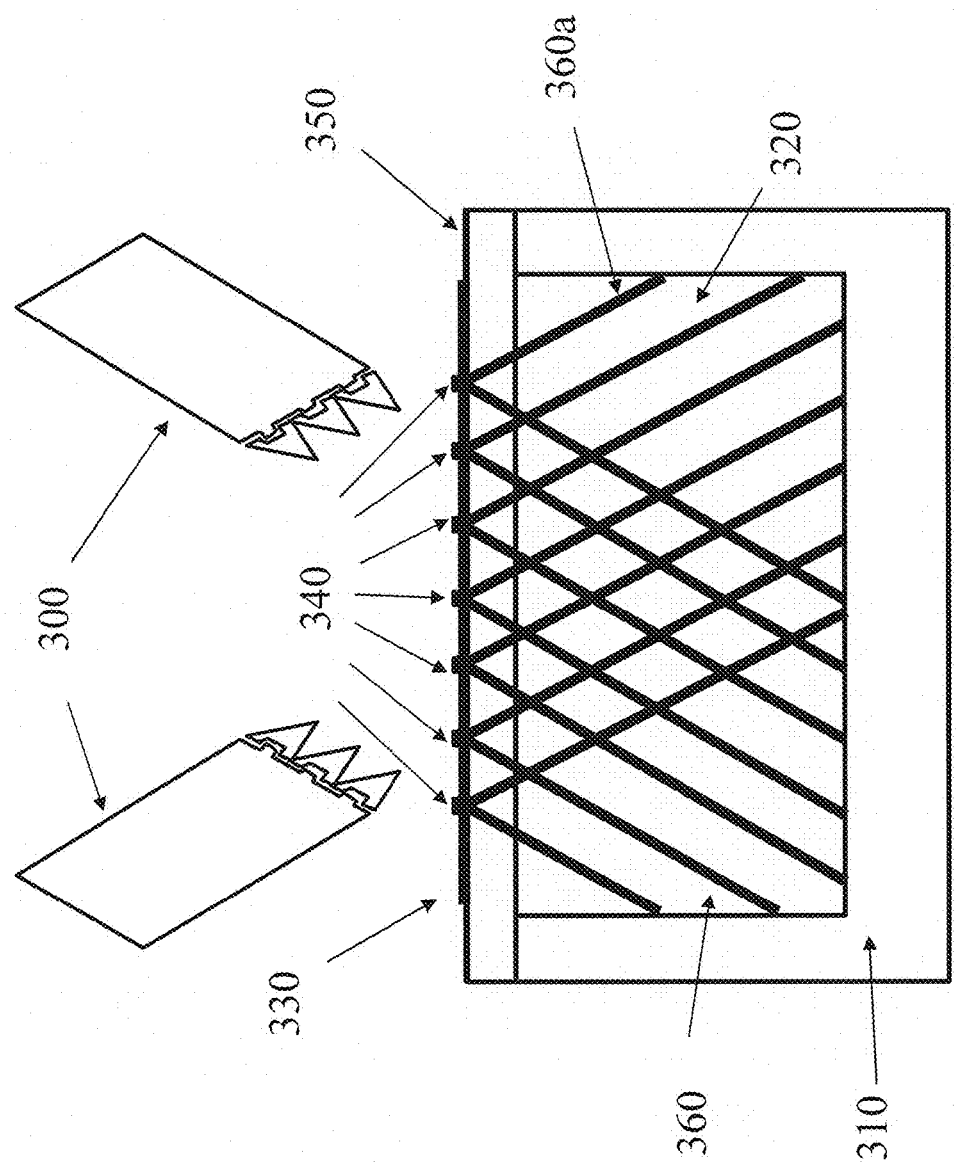
FIG. 3 is a schematic diagram of a system for forming a structure of an embodiment of the present invention from multiple waveguides created using a single collimated beam or multiple collimated beams through multiple apertures.
Figure 4B:
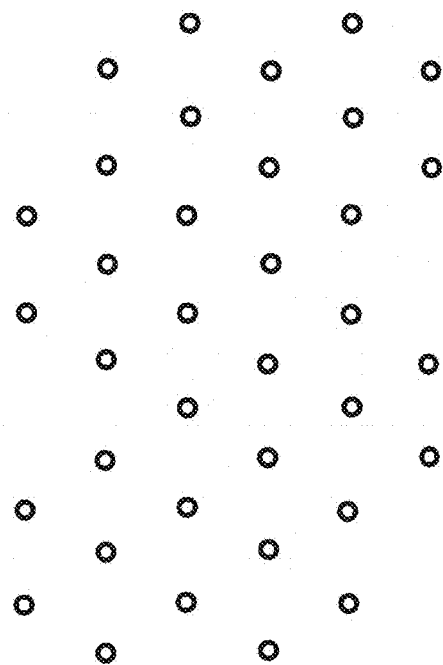
FIG. 4b illustrates an example of a hexagonal mask pattern (or a hexagonal mask aperture pattern) according to embodiments of the present invention.
Figure 4A:
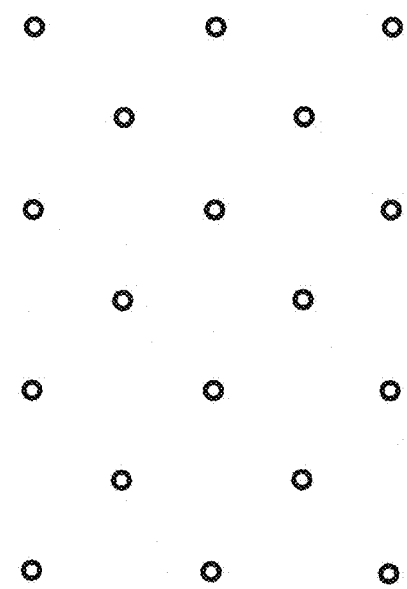
FIG. 4a illustrates an example of a square mask pattern (or a square mask aperture pattern) according to embodiments of the present invention.

With reference to FIG. 3, a system for forming a three-dimensional polymer microstructure according to an embodiment of the present invention includes one or more collimated light sources 300, a reservoir (mold) 310 having a volume of monomer 320 that will polymerize at a wavelength of collimated light beams provided by the light sources 300, and a patterning apparatus, such as a mask 330 with multiple apertures (open areas) 340. Each of the apertures 340 has a given shape and dimension substantially matching a cross-section geometry of a waveguide (e.g., waveguide 360a). Between the mask 330 and the monomer 320, there may be a substrate 350. Here, in FIG. 3, a truly 3D network can be formed because the intersecting polymer waveguides 360 will simply polymerize together, but will not interfere with waveguide propagation. Also, the spacing between the plurality of waveguides 360 corresponds with the pattern of the plurality of apertures 340. The pattern of the apertures 340 may, for example, be in a square pattern as shown in FIG. 4a and/or in a hexagonal pattern as shown in FIG. 4b. The hole (aperture) spacing, i.e., distance between apertures 340 in the mask 330, and the number of waveguides 360 formed from each of the apertures 340 will determine the open volume fraction (i.e. open space) of the formed three-dimensional ordered microstructure (or the formed open-cellular polymer micro-truss structure).

As such, through the system of FIG. 3, a three-dimensional ordered microstructure of an embodiment of the present invention can be designed for a given application. The design parameters include: 1) the angle and pattern of the polymer waveguides with respect to one another, 2) the packed core characteristics, or relative density of the resulting cellular structure (or the open volume fraction), and 3) the cross-sectional shape and dimensions of the polymer waveguides.

Figure 5:
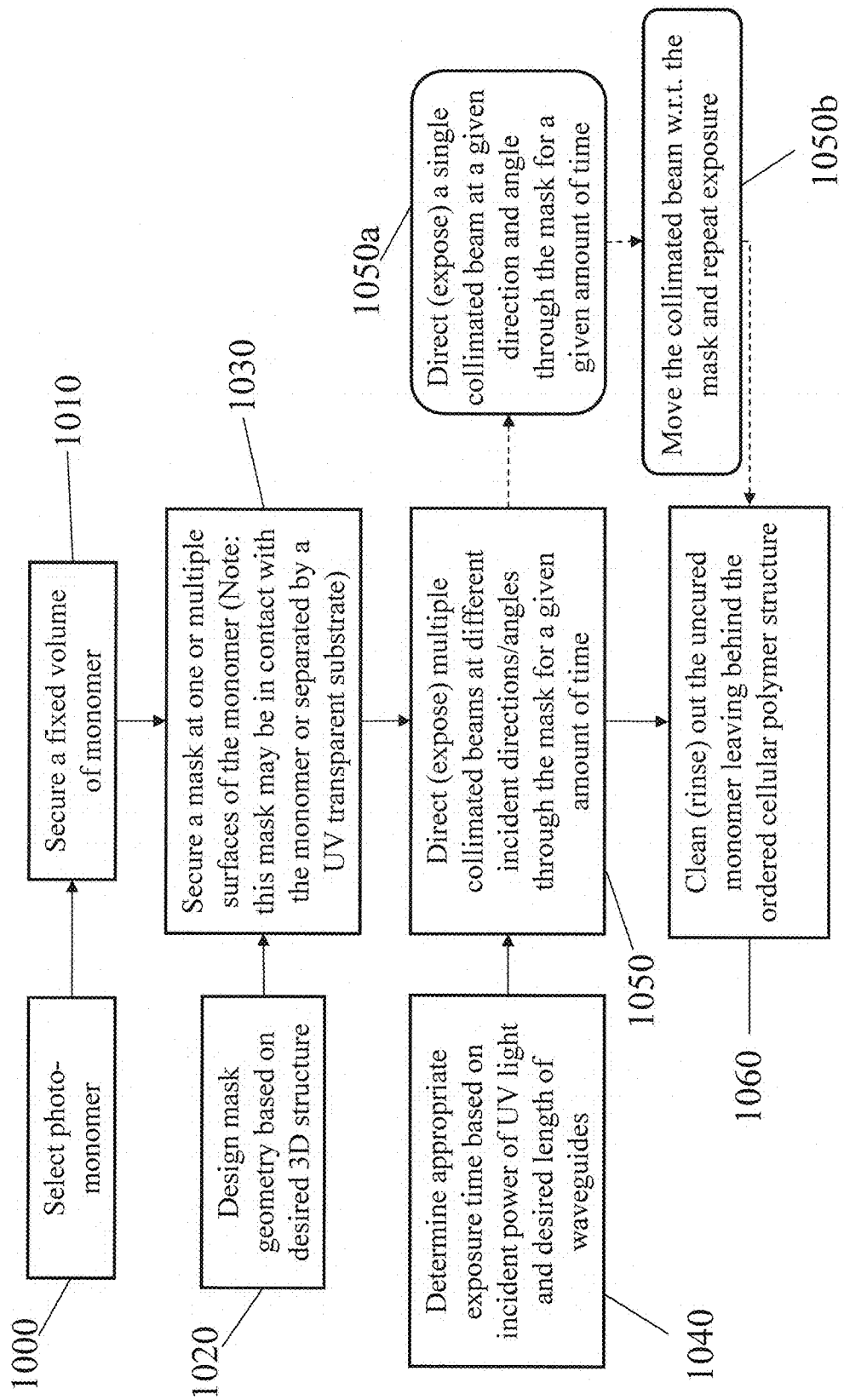
FIG. 5 is a process flow diagram for forming one or more polymer waveguides of a structure according to an embodiment of the present invention.

In more detail, FIG. 5 shows a method of forming a three-dimensional ordered microstructure (or an open-cellular polymer micro-truss structure) according to an embodiment of the present invention. As illustrated in FIG. 5, a photo-monomer is selected in block 1000. In block 1010, a volume of the selected photo-monomer is secured (e.g., in a reservoir). A mask geometry is designed based on a desired three-dimensional structure in block 1020. A patterning apparatus, such as a mask having the designed geometry, is secured in block 1030. Here, the secured mask has at least one aperture between at least one collimated light source and the volume of the selected photo-monomer. In addition, the mask may be in contact with the monomer or separated by a substrate (e.g., by a UV transparent substrate).

In block 1040, an appropriate exposure time is determined based on incident power of a collimated light beam from the at least one collimated light source (e.g., an incident power of a UV light) and a desired length of one or more waveguides. The collimated light beam from the at least one collimated light source is directed to the mask for a period of exposure time so that a portion of the collimated beam passes through the mask and is guided by the at least one aperture into the photo-monomer to form at least one waveguide through a portion of the volume of the photo-monomer. Here, the at least one waveguide has a cross-sectional geometry substantially matching the designed aperture geometry on the mask.

In one embodiment as shown in block 1050, multiple collimated beams at different incident directions and/or angles are directed through the mask for a given amount of time.

Alternatively, as shown in blocks 1050*a*, a single collimated beam at a given direction and angle is directed through the mask for a given amount of time. Then, at block 1050*b*, the collimated light beam is moved with respect to the mask and the exposure is repeated.

Then, at block 1060, any uncured photo-monomer is removed to leave behind a three-dimensional ordered polymer microstructure (or an open-cellular polymer micro-truss structure). Here, in one embodiment, the plurality of polymer waveguides are used to form the three-dimensional ordered polymer microstructure, and the three-dimensional ordered polymer microstructure corresponds with the pattern of the plurality of apertures.

The resulting three-dimensional polymer microstructure can be formed in seconds in the area where exposed to the incident collimated beam. Since the incident light and the monomer remain fixed with respect to one another during the formation of a polymer waveguide, the exposure area of the collimated beam(s) can be scanned over a larger surface area of monomer, leading to the formation of large-area structures. Alternatively, in one embodiment, a volume of monomer can continuously be fed under a fixed incident light pattern (created from a mask and collimated light) leading to a path for mass production.

As described, once the polymer cellular structure is formed in the volume of monomer, the remaining unpolymerized material (monomer) is removed leaving an open cellular polymer material that is the three-dimensional ordered microstructure (or the open-cellular polymer micro-truss structure). By way of example, a solvent that dissolves the monomer (but not the polymer) may be used to aid in the monomer removal.

With reference back to FIGS. 1 and 2, the truss elements 12, 14, 16 of the microstructure 10 define an open volume (i.e. free space) of the microstructure 10. In one embodiment, the microstructure 10 defines a free space of not less than about 40% by volume and not greater than about 99% by volume. In another embodiment, the microstructure 10 defines a free space of not less than about 70% by volume and not greater than about 95% by volume.

The truss elements 12, 14, 16 intersect at the nodes 18 to form symmetrical angles in three dimensions (three orthogonal directions). The symmetrical angles relative to the xz-plane (see, FIG. 1), can measure between 0° and 90°. That is, truss elements 12, 14, 16 interpenetrate each other to form "perfect" nodes: each of the truss elements 12, 14, 16 defines an angle relative to a compression surface of the microstructure 10 (e.g. a surface extending along a direction of the xz-plane), and the respective angles defined by the truss elements 12, 14, 16 are substantially equal to one another. However, embodiments of the present invention are not limited thereto.

The truss elements 12, 14, 16 have an intrinsically high strength due to their small scale. In one embodiment, each of the truss elements 12, 14, 16 has a diameter of between 10 µm and 2 mm. In one embodiment, each of the truss elements 12, 14, 16 has a diameter of not greater than about 500 µm.

In another embodiment, each of the truss elements 12, 14, 16 has a diameter of not greater than about 200 µm. In another embodiment, each of the truss elements 12, 14, 16 has a diameter of not greater than about 1 µm. The truss elements 12, 14, 16 are configured to have a correspondingly small aspect ratio (e.g., length/diameter ratio) for withstanding a bending moment. Here, each of the truss elements 12, 14, 16 has a length not greater than about 100 µm such that the truss elements can better withstand a mechanical load applied to the microstructure 10. As such, the truss elements 12, 14, 16 experience little, if any, bending deformation during application of the mechanical load to the microstructure 10.

At certain size scales or diameters (e.g., the size scales or diameters described above), the strength of the truss elements is increased, which corresponds to an increased strength of the microstructure 10. In one embodiment, each of the truss elements 12, 14, 16 has molecular alignment extending along an axial direction of the truss element. As such, an anisotropic material is produced, which provides a substantial degree of stiffness and/or strength along the axial direction. In one embodiment, in a material that is composed of long molecular chains (e.g., polymers), the molecules thereof can be aligned along a direction to provide an increased degree of mechanical strength and/or stiffness along the alignment direction. In more detail, where the molecular alignments of the truss elements 12, 14, 16 extend along the corresponding axial directions, the truss elements 12, 14, 16 are configured to axially transfer a mechanical load applied to the microstructure 10.

As described above, the microstructure 10 withstands the mechanical load, e.g., via axial tension and compression of the truss elements 12, 14, 16. Molecular alignment of the truss elements 12, 14, 16 along their respective axial directions lends additional strength and/or stiffness to the truss elements 12, 14, 16 and, accordingly, also to the microstructure 10.

In one embodiment, the truss elements 12, 14, 16 are configured to provide the microstructure 10 with a stretch-dominated behavior under a compression load applied to the microstructure 10. Such stretch-dominated behavior is contrasted from the bending-dominated behavior (e.g. of randomly oriented cellular structures), as described in Ashby, "The Properties Of Foam And Lattices," Philosophical Transactions—Royal Society Of London Series A Mathematical Physical And Engineering Sciences, Vol. 364, 2006, which is incorporated by reference herein in its entirety.

In a bending-dominated structure, the elastic modulus is proportional to the square of the relative density $\rho'/\rho_s'$, where $\rho'$ is the density of the cellular material and $\rho_s'$ is the density of the solid from which it is constructed. In contrast, a stretch-dominated structure (such as microstructure 10), has a compressive elastic modulus (E) directly proportional to both the relative density thereof and the modulus ($E_s$) of the solid material portion of the microstructure 10, as expressed in equation (1) below:

$$E = E_s (\sin^4 \theta)(\rho/\rho_s) \quad (1)$$

where $\rho$ is a density of the microstructure 10, $\rho_s$ is a density of a solid material portion of the microstructure 10, $\theta$ is an angle of at least one of the truss elements 12, 14, 16 relative to a compression surface of the microstructure 10, and $E_s$ is a modulus of the solid material portion of the microstructure 10. As such, the elastic modulus of a structure of embodiments of the present invention is also proportional to a geometric function of the angle $\theta$ of the structure, and $\theta$ can accordingly be chosen to vary (e.g., increase or reduce) the elastic modulus.

With reference back to FIGS. 1 and 2, the microstructure 10 includes truss elements 12, 14, 16 respectively extending along A, B, and C directions. However, embodiments of the present invention are not limited thereto. For example, with reference to FIG. 6, a structure of an embodiment of the present invention may include truss elements defined by self-propagating polymer waveguides and extending along D, E, F, G, H, I, J and K directions, respectively. For example, a structure according to an embodiment of the present invention may include eight truss elements, each of which extends along a corresponding one of eight varying directions. Here, similar to the embodiment shown in FIGS. 1 and 2, the eight truss elements interpenetrate each to form nodes of a continuous material with a three-dimensional microstructure order. However, embodiments of the present invention are not limited thereto, and may include more or fewer than eight truss elements.

In a further embodiment of the present invention, an open volume of a cellular structure is filled at least partially with a material different from the material of the cellular structure itself, thereby creating an ordered bi-phase composite. Also in a further embodiment of the present invention, one or more truss elements of a cellular structure are coated with a material different from the material of the cellular structure itself to adjust the thermal behavior thereof. Also in a further embodiment of the present invention, base elements of a cellular structure are coated with a material different from the material of the cellular structure itself, and the base elements are removed to create a self-supporting structure having continuous but separated volumes.

The size scale and the features of structures of embodiments of the present invention can be utilized in heat transfer applications.

One embodiment of the present invention creates a functionally graded heat transfer core (e.g., a functionally graded wick structure) with an ordered open-cellular three-dimensional (3D) microstructure. Here, the term "functionally graded" refers to a spatial variation in the physical microstructure—and thus the properties—through the thickness of the material (the y direction in FIG. 1), and its formation is discussed in U.S. patent application Ser. No. 12/317,210 filed on Dec. 18, 2008, entitled "Functionally-Graded Three-Dimensional Ordered Open-Cellular Microstructure And Method Of Making Same," the entire content of which is incorporated herein by reference. The variation in physical properties as a function of the thickness may be achieved through layers of the open cellular three-dimensional microstructure with different formation characteristics.

In one embodiment of the present invention, a heat pipe with a wick structure composed of a three-dimensional ordered microstructure is provided.

According to certain embodiments of the present invention, all structural heat pipe designs are based on a sandwich panel design. Sandwich panels are lightweight and mechanically efficient structures. Heat pipes yield effective thermal conductivities greater than solid metal blocks (e.g., solid copper blocks). By adding heat pipe functionality to sandwich panels, a class of lightweight, mechanical efficient and highly thermally conductive materials is enabled.

As envisioned, heat pipe designs according to embodiments of the present invention have a number of similar features:

1. stiff, thin face sheets
   a. materials with high thermal conductivity are preferred
   b. metals (e.g. Al and Cu make good candidates)
2. a lightweight core composed of an open cellular structure, either ordered (e.g. FIG. 2) or random
   a. part of the core will carry vapor flowing from the hot region to the cold region
   b. part of the core will carry liquid flowing from the cold region to the hot region
   c. the core can be polymer, metal, ceramic, etc.
3. connections between all adjacent layers to provide load transfer As non-limiting examples connections can be adhesives, solders, and weldings.
4. an encapsulated working fluid
   a. the working fluid can be water, alcohols, hydrocarbons, halogenated hydrocarbons, etc. or an azeotrope of two fluids
   b. the working fluid should not solvate any of the components of the system because otherwise, the lifetime of the device will be reduced through dissolution and redeposition of the dissolved species during the evaporation-condensation cycle of the working fluid within the heat pipe
5. a hermetic seal for preventing (or protecting) the working fluid from escaping and external gases and liquids from entering
6. a wick with small pores to generate a capillary pressure to provide for fluid motion
   a. the pores could be the foam pores, pores in a mesh, and/or texturing of the foam and/or face sheets, or a hydrogel Referring to FIGS. 7a, 7b, 7c, and 7d, specific designs of heat pipes according to embodiments of the present invention are illustrated. Note that the illustration in each of FIGS. 7a, 7b, 7c, and 7d is a schematic cross-section of a unit cell that can be repeated in a periodic manner to yield larger structures.

Figure 7A:
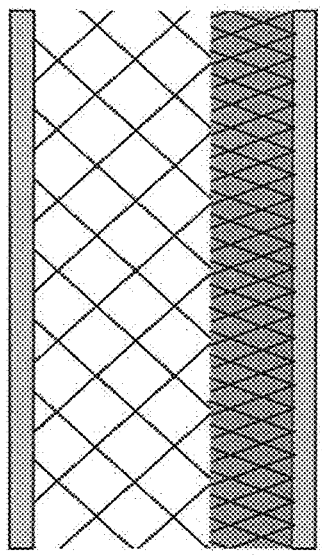
FIGS. 7a, 7b, 7c, and 7d schematically illustrate four structural sandwich panel heat pipe designs utilizing a micro-scale truss core and face sheets.
Figure 7B:
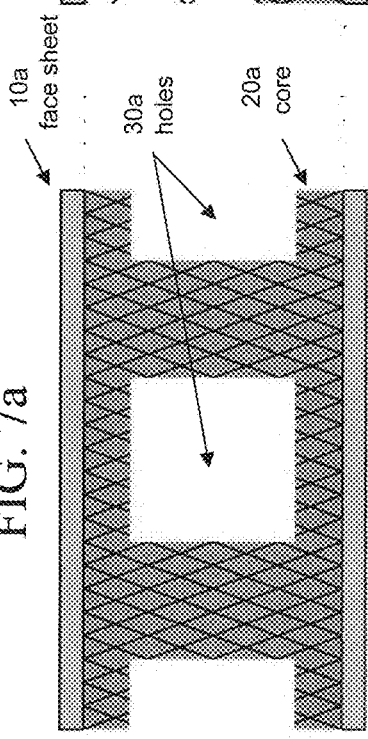
Figure 7C:
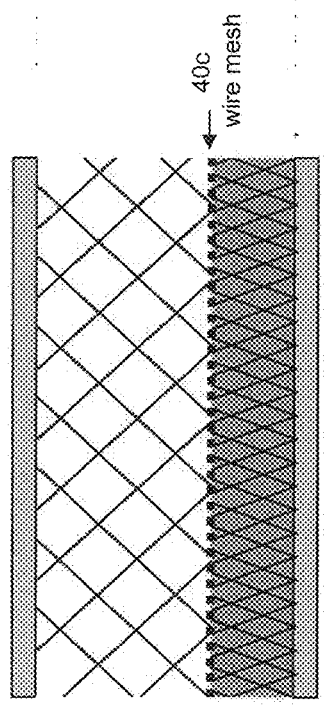
Figure 7D:
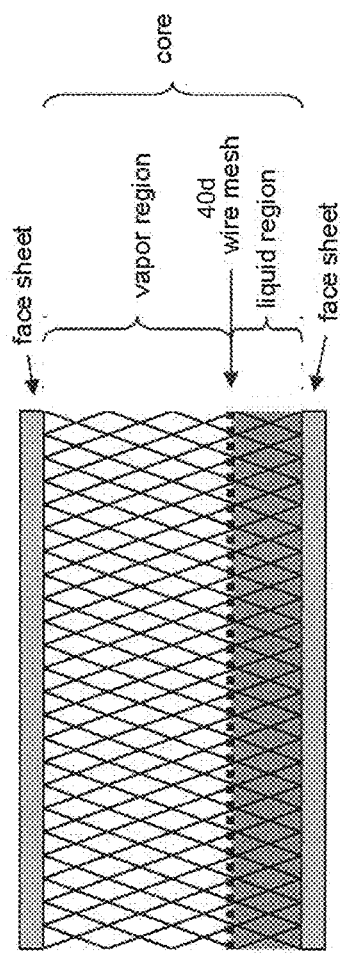
Figure 17A:
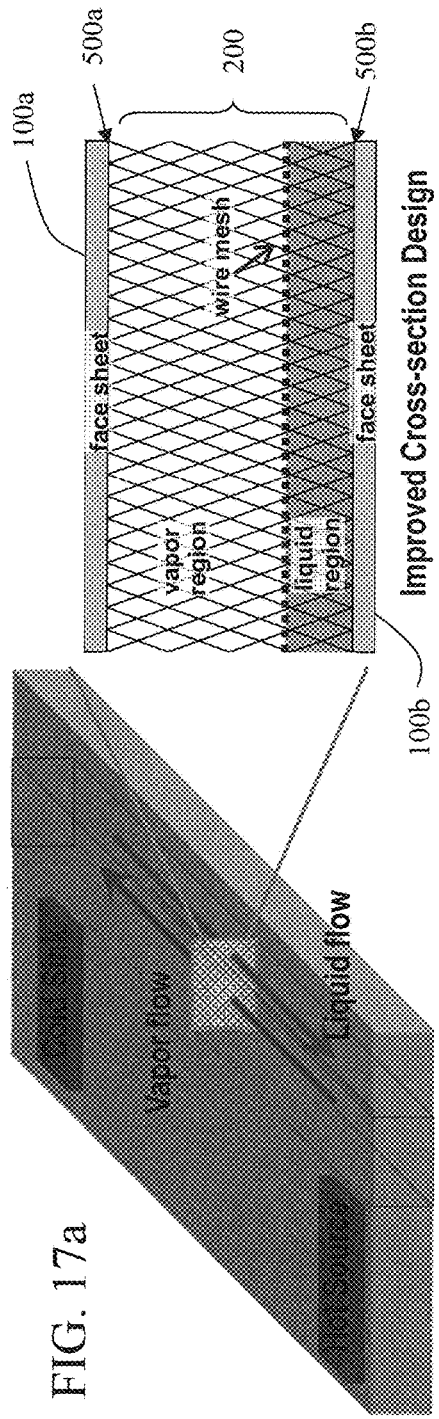
FIGS. 17a and 17b schematically illustrates a sandwich panel heat pipe according to an embodiment of the present of the present invention.

In the design illustrated in FIG. 7a, the heat pipe includes two face sheets 10a with a core 20a therebetween. Here, the core 20a is composed of an ordered cellular material with large holes 30a cut in it. One side of the ordered cellular material core 20a is adjacent to each face sheet 10a, thereby providing direct contact between the liquid and the face sheets 10a for better thermal transfer. Pillars of ordered cellular material core 20a separate the face sheet-ordered cellular sheet lamellae. The liquid is held in the ordered truss of the core 20a by capillary forces, while the vapor flows through the larger open regions. This design provides larger cross-sectional area pathways for vapor flow, thus decreasing the pressure loss due to vapor flow. A number of variations of this design are possible, such as:

1. the ordered cellular pore size and other parameters could vary in the core 20a (either gradually or with different regions—sheets and pillars—having distinct parameters)
2. the micro-truss could be substituted with any suitable open cellular foam in part or all of the design In the design illustrated in FIG. 7b, the heat pipe also includes two face sheets with a core therebetween. However, in FIG. 7b, the core is composed of a stack of two layers of micro-structured ordered cellular material (micro-truss). One layer, the liquid region, has finer pores and the other layer, the vapor region, has larger pores. The larger pores of the vapor region reduce pressure losses in the vapor region while the smaller pores of the liquid region provide the capillary pressure necessary to generate the fluid flow. That is, in the embodiment in FIG. 7b, a functionally graded heat transfer core is created, and the formation of a functionally grated structure that can be utilized as the functionally graded heat transfer core is discussed in U.S. patent application Ser. No. 12/317,210 filed on Dec. 18, 2008, now U.S. Pat. No. 8,195,023, entitled "Functionally-Graded Three-Dimensional Ordered Open-Cellular Microstructure And Method Of Making Same." A number of variations on this design are possible, such as:

1. the core could be composed of a three-layer stack (fine pores-large pores-fine pores) to keep fine pore layers adjacent to both face sheets In each of the designs illustrated in FIGS. 7c and 7d and according to embodiments of the present invention, the core is composed of a stack of two layers of micro-truss separated by a mesh screen 40c, 40d therebetween. One micro-truss layer constitutes the vapor region, while the other constitutes the liquid region. The mesh screen 40c, 40d provides the small pores necessary for fluid flow so that the size of the micro-truss-pores in the liquid region can be larger. That is, the designs illustrated in FIGS. 7c and 7d allow for large pores in the bulk of the liquid region (with smaller pores only at the interface between the liquid and vapor regions) to decouple the capillary pressure generated (due to the pores at the interface) from the pressure loss due to frictional losses (due to the pore size in the bulk of the region). This design strategy is similar to heat pipes which have arterial wicks (however the design here is more mechanically efficient). A number of variations on this design are possible, such as:

1. The micro-truss in the vapor and liquid region can have the same (FIG. 7d) or different (FIG. 7c) parameters, but in either case, the mesh pore size should be less than the micro-truss pore size
2. The core could be composed of a three-layer micro-truss stack (liquid region-vapor region-liquid region) with 2 layers of mesh (each between a liquid region-vapor region interface) liquid regions adjacent to both face sheets
3. The micro-truss could be substituted with any suitable open cellular foam in part or all of the design with the mesh pore size less than the cellular foam pore size The design of FIG. 7b and the designs of FIGS. 7c and 7d are easier to manufacture than the design of FIG. 7a because the designs of FIGS. 7b, 7c and 7d do not require cutting large vapor channels and instead can be created by simply laying down layers of material. Also, the fluid flow within these designs (i.e., vapor flow and liquid flow) according to an embodiment of the present invention is shown in FIG. 17a.

Figure 8:
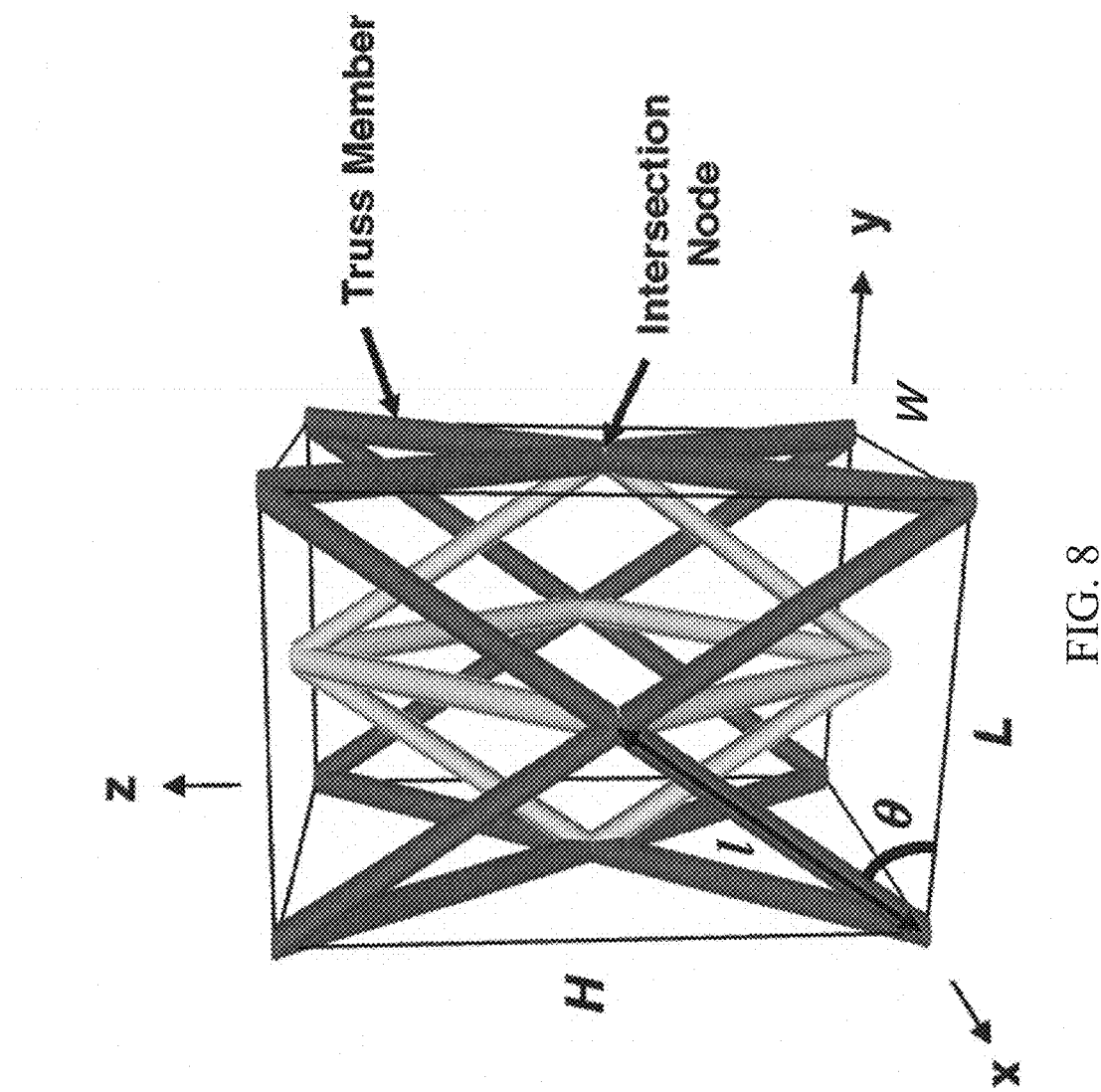
FIG. 8 schematically illustrates a micro-truss unit cell with relevant dimension labeled and utilized to fabricate the designs of FIGS. 7A, 7B, 7C and 7D.

FIG. 8 schematically illustrates a micro-truss unit cell with relevant dimension labeled and utilized to fabricate the designs of FIGS. 7a, 7b, 7c and 7d. Here, the unit cell has a length L extending along a first axis (e.g., the x-axis), a width W extending along a second axis (e.g., the y-axis), and a height H extending along a third axis (e.g., the z-axis). In addition, the unit cell is composed of a plurality of truss members (or struts), each of the struts at the face of the unit cell has a length 1 and is shown to form an angle 2 with the second axis or y-axis.

An example fabrication sequence for the design described in FIG. 7b is as follows:

1. create micro-truss with a large unit cell size as disclosed in U.S. patent application Ser. No. 11/580,335, filed on Oct. 13, 2006, now U.S. Pat. No. 7,382,959, entitled "Optically Oriented Three-Dimensional Polymer Microstructures," the entire content of which is incorporated herein by reference
2. create micro-truss with a small unit cell size as disclosed in U.S. patent application Ser. No. 11/580,335, filed on Oct. 13, 2006, now U.S. Pat. No. 7,382,959, entitled "Optically Oriented Three-Dimensional Polymer Microstructures"
   a. either or both of the micro-truss layers could be converted to another material
3. dip each side of each micro-truss layer in adhesive
   a. the adhesive could be epoxy, uncured thiolene monomer, etc.
4. cut two face sheets with area larger than micro-truss layer area
5. stack: face sheet-small micro-truss-large micro-truss-face sheet
6. cure adhesive to bond micro-truss layers to each other and to face sheets
7. situate a small diameter pipe (for evacuating and filling the heat pipe) in between face sheets, but extending past face sheets
   a. alternatively could have end-caps made which have small diameter filling pipe already sealed in place
8. bond face sheets along perimeter of heat pipe
   a. could be done with epoxy, welding (laser, MIG, TIG, arc, etc.), diffusion bonding, or ultrasonic bonding
9. evacuate heat pipe with vacuum pump
   a. heating up the heat pipe will help it to outgas faster and will reduce pump down time
10. purify working fluid
    a. in one embodiment, freeze-pump-thaw purification is utilized
11. fill heat pipe with a suitable amount of working fluid
12. crimp and seal small diameter pipe used for filling
    a. seal could be welding, cold-weld, diffusion bond, or ultrasonic bonding To fabricate the heat pipes in FIGS. 7c and 7d, a piece of mesh (or other thin porous sheet) needs to be placed between micro-truss layers in step 5 above and epoxied to both micro truss layers. All other steps remain the same. Two alternate methods of fabricating the micro-truss core with a mesh inside follow:

1. dual side exposure method
   a. situate piece of mesh inside micro-truss fabrication mold
   b. fill mold with monomer precursor
   c. expose top and bottom sides of mold to UV light through a hole array (thus forming micro-truss)
      i. hole arrays on top and bottom could have different patterns (diameters, pitches, group symmetry, etc.)
   d. dissolve unreacted monomer
   e. post cure micro-truss
   f. convert micro-truss to another material if desired
2. single-side exposure method
   a. situate piece of mesh inside micro-truss fabrication mold
   b. fill mold with monomer precursor
   c. expose top side of mold to UV light through a hole array (thus forming micro-truss)
   d. dissolve unreacted monomer
   e. post cure micro-truss
   f. convert micro-truss to another material if desired In both cases, light will propagate through the mesh, thus anchoring the mesh to the micro-truss and providing for load transfer paths.

To fabricate the heat pipe in FIG. 7a, a micro-truss core layer with vapor channels is used instead of the micro-truss layer stack in step 5 above. There are a number of options to fabricate the micro-truss core layer with vapor channels:

1. the channels could be cut from a large piece of micro-truss
2. smaller sections of micro-truss could be assembled with epoxy
3. a mold for micro-truss fabrication could be made with solid inserts (which could be optically transparent). During the fabrication, the inserts would occupy the same position as the resulting vapor channels. Removal of the inserts after photopolymerization would yield open vapor channels.

Embodiments of the present invention provides a two-pronged approach to design a heat pipe. Here, the first prong is directed toward providing design tools for a multifunctional micro-truss based heat pipe that can be useful for numerous applications (e.g., thermal, structural, lightweight, etc.). The second prong is directed toward fabricating and testing the designed multifunctional micro-truss based heat pipe that uses the design tool to select desired configurations, generates prototypes to demonstrate multifunctional capabilities, and/or has a process in place to tailor to specific applications and future research requests.

In more detail, aspects of embodiments of the present invention are directed toward systems and methods capable of generating robust desired designs for multifunctional micro-truss based heat pipe. The designs include:

1. a number of design criteria, including two or more of the following:
   a. density/total mass
   b. flexural stiffness
   c. flexural strength
   d. shear stiffness
   e. shear strength
   f. tensile/compressive stiffness
   g. tensile/compressive strength
   h. heat pipe maximum heat flux
   i. heat pipe temperature difference
   j. effective thermal conductivity
   k. maximum energy absorption
   l. capillary pressure
2. robustness parameters (not necessary to include, but if they are included it is possible to just have one criterion)
   a. a parameter describing the inherent process and material property variations (there could be individual parameters for each material property and each criterion dimension)
   b. a parameter describing the acceptable performance deviation (there could be one parameter for each criterion)
3. dimensions to be designed, which could include
   a. The angle of the micro-truss struts
   b. The micro-truss strut length
   c. The micro-truss strut radius
4. physical properties of the materials to be used (which could be functions of the dimensions to be designed or other parameters), for instance
   a. density (of solid, liquid, gas phases)
   b. young's modulus
   c. yield strength
   d. thermal conductivity
   e. surface tension
   f. viscosity An embodiment of the invention can also be utilized to compare different material combinations and select the improved materials set for desired multiple functional performance.

An embodiment of the invention can also be utilized to compare different archetype designs to select the best archetype design and then select the improved dimensions of that best archetype design.

Figure 9:
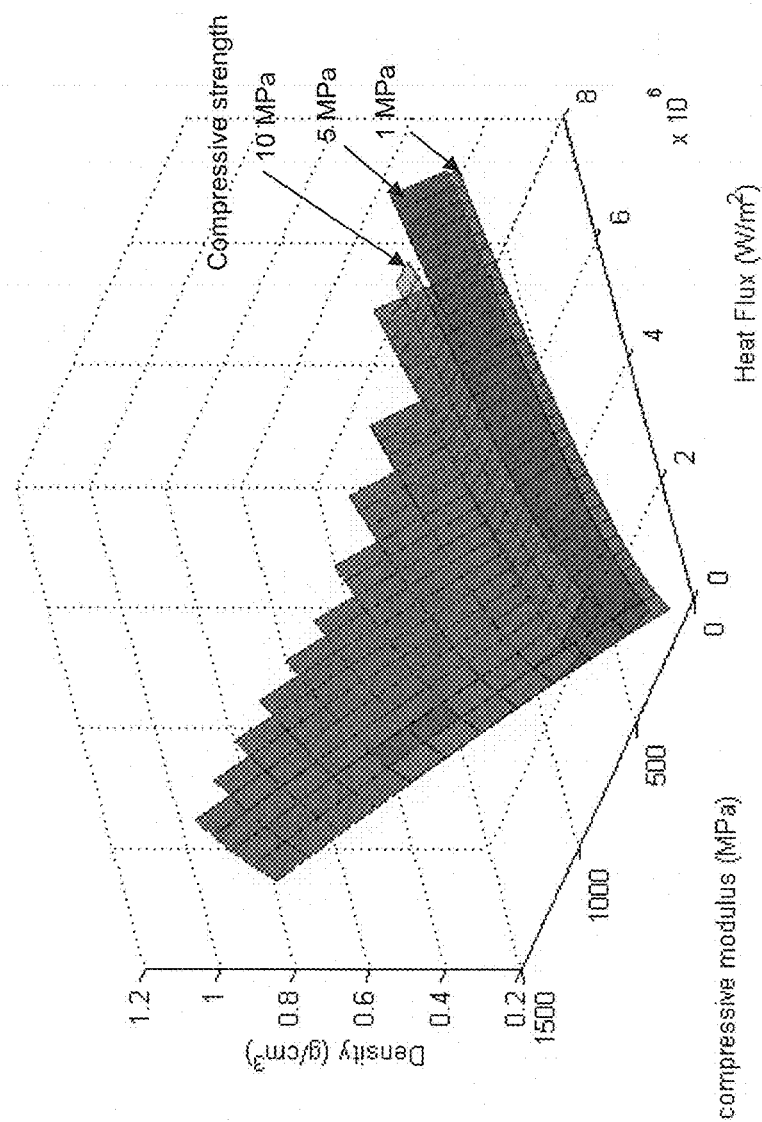
FIG. 9 is a plot showing performance in 4-criteria space of sandwich panel heat pipe design in FIG. 7D with aluminum face sheets, polymer micro-truss core, water working fluid, and stainless steel wire 500 mesh.

FIG. 9 is a plot showing exemplary performance in a 4-criteria space of sandwich panel heat pipe design in FIG. 7d with aluminum face sheets, polymer micro-truss core, water working fluid, and stainless steel wire 500 mesh.

FIGS. 10a, 10b, 10c, and 10d illustrate improved dimensions for sandwich panel heat pipe design in FIG. 7d with aluminum face sheets, polymer micro-truss core, water working fluid, and stainless steel wire 500 mesh. (Here, in one embodiment, all solutions converge to one unit cell in the liquid region, the minimum bound.)

Figure 11:
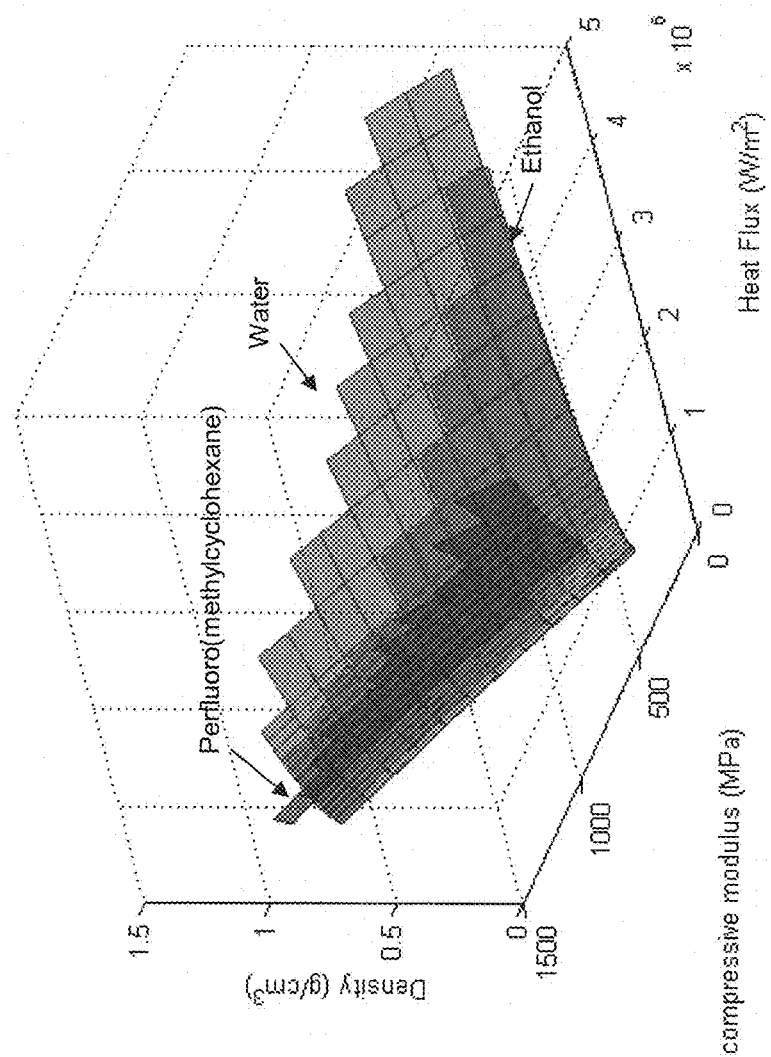
FIG. 11 is a plot showing performance of structural heat pipe for varying working fluids with aluminum face sheets, polymer micro-truss core, stainless steel wire 500 mesh, and compressive strength ≥1 MPa.

FIG. 11 is a plot showing performance of structural heat pipe for varying working fluids with aluminum face sheets, polymer micro-truss core, stainless steel wire 500 mesh, and compressive strength ≥1 MPa.

FIGS. 12a, 12b, 12c, and 12d illustrate plots showing improved dimensions of structural heat pipe for varying working fluids with aluminum face sheets, polymer micro-truss core, stainless steel wire 500 mesh, and compressive strength ≥1 MPa. (Here, in one embodiment, all solutions converge to one unit cell in the liquid region, the minimum bound.)

Figure 13:
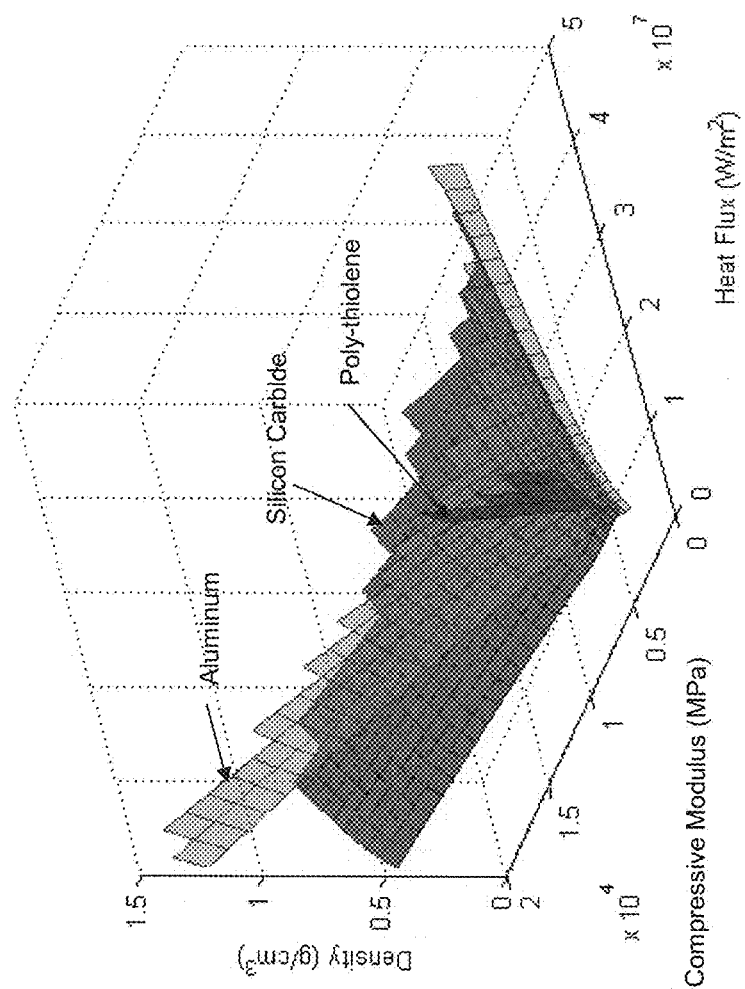
FIG. 13 is a plot showing performance of structural heat pipe for varying micro-truss material cores with aluminum face sheets, water working fluid, stainless steel wire 500 mesh, and compressive strength ≥1 MPa.
Figure 14A:
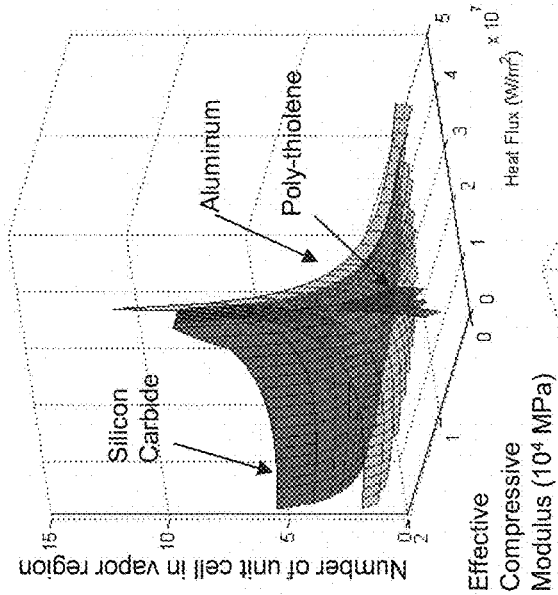
FIGS. 14a, 14b, 14c, and 14d illustrate plots showing improved dimensions of structural heat pipe for varying micro-truss material cores with aluminum face sheets, water working fluid, stainless steel wire 500 mesh, and compressive strength ≥1 MPa.
Figure 14C:
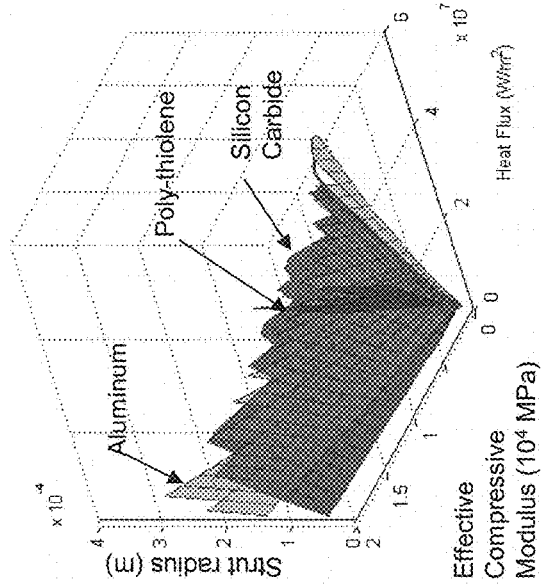
Figure 14B:
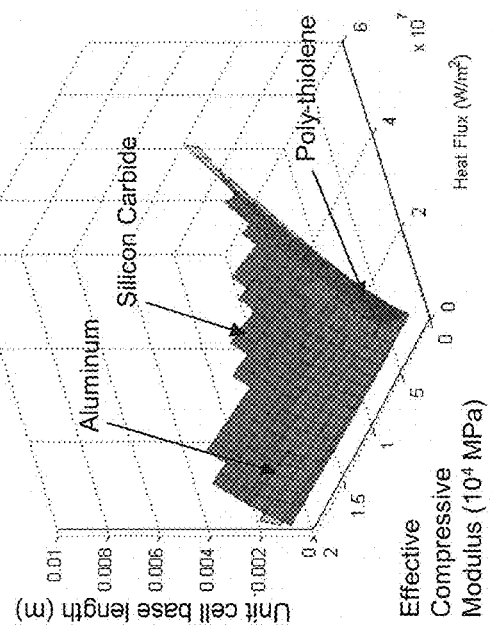
Figure 14D:
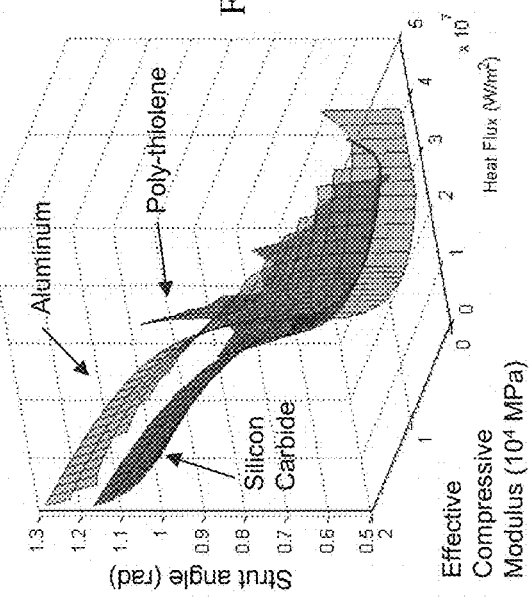

FIG. 13 is a plot showing performance of structural heat pipe for varying micro-truss material cores with aluminum face sheets, water working fluid, stainless steel wire 500 mesh, and compressive strength ≥1 MPa.

FIGS. 14a, 14b, 14c, and 14d illustrate plots showing improved dimensions of structural heat pipe for varying micro-truss material cores with aluminum face sheets, water working fluid, stainless steel wire 500 mesh, and compressive strength ≥1 MPa.

Here, in one embodiment, using a different face material (other than aluminum) makes no changes to the configured dimensions of the micro-truss core in the above cases (i.e. considering compressive stiffness and strength), and it only changes the average density of the resulting sandwich panel if a face sheet of higher or lower density is used. When considering flexural stiffness and strength, different face sheet materials will change the configured dimensions of the core micro-truss material as can be derived in FIG. 14a, 14b, 14c, 14d.

Figure 15B:
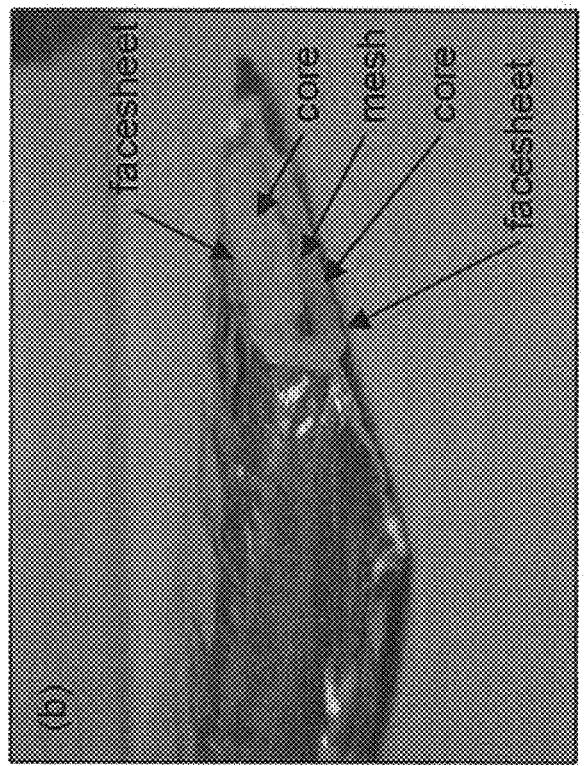
FIG. 15b is a cut-away view of the structural heat pipe.
Figure 15A:
FIG. 15a is a top view of a structural heat pipe.

FIG. 15a is a top view of a structural heat pipe, and FIG. 15b is a cut-away view of the structural heat pipe. As shown in FIGS. 15a and 15b, the heat pipe is composed of two face sheets with a core structure therebetween. Here, the core structure is composed of a first core and a second core with a mesh therebetween to separate or define the first core from the second core.

FIG. 16 illustrates a method for fabricating a heat pipe composed of micro-truss core sandwich panels according to an embodiment of the present invention. Here, the method begins by the formation of a micro-truss material. The micro-truss material is then formed into micro-truss wick (or micro-truss core), e.g., by forming large holes into the micro-truss material and/or providing a mesh between two portions of the micro-truss material. The formed micro-truss core is then positioned between two metal foil face sheets and sealed within the two metal foil face sheets, e.g., by utilizing ultrasonic metal welding.

Figure 17B:
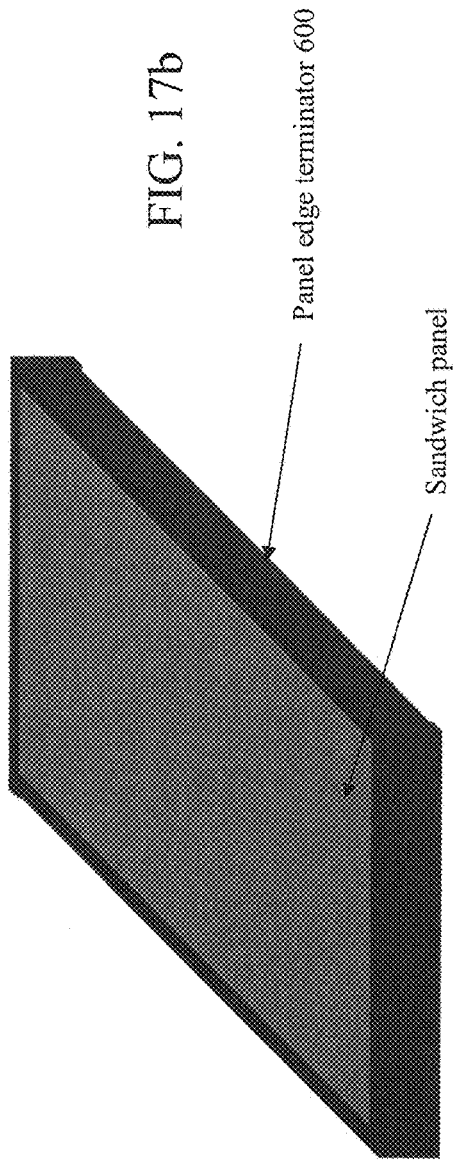
Figure 18B:
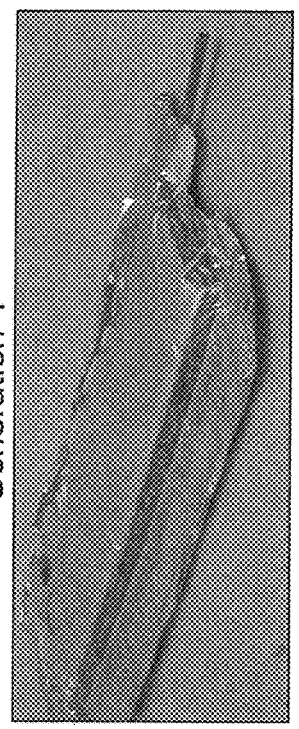
FIGS. 18a, 18b, 18c, and 18d are color pictures showing various generations (i.e., generations 0, 1, 2, and 3) of sandwich panel heat pipes that have been reduced to practice.
Figure 18D:
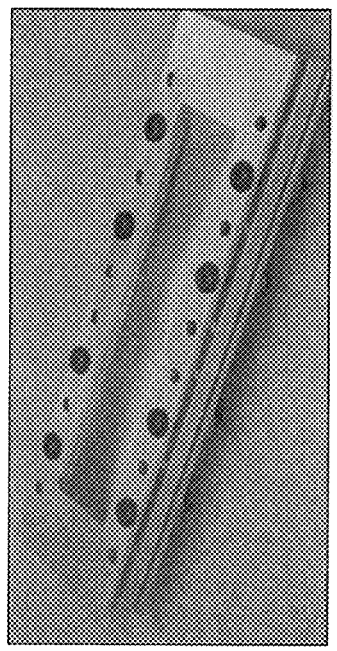
Figure 18A:
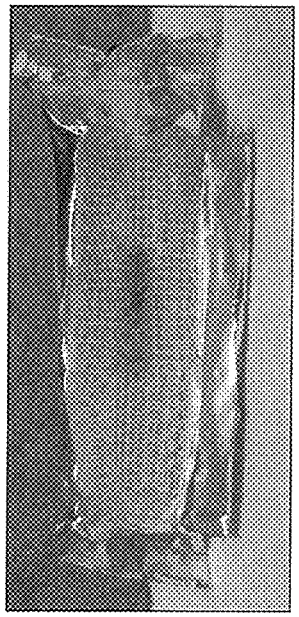
Figure 18C:
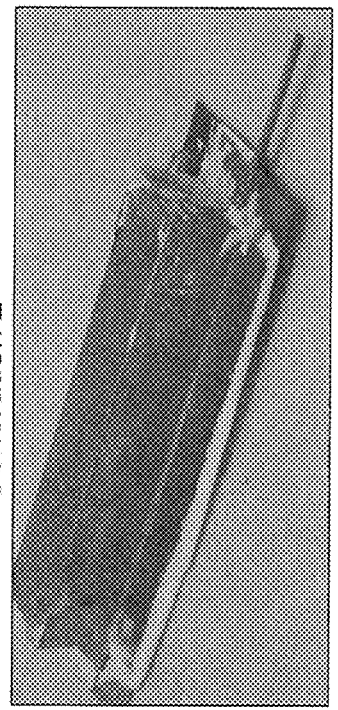

FIGS. 17a and 17b schematically illustrates a sandwich panel heat pipe according to an embodiment of the present of the present invention. As shown in FIGS. 17a and 17b, the sandwich panel heat pipe has a higher temperature region at (or in contact with) a hot source and a lower temperature region at (or in contact with) a cold sink, and includes a first face sheet 100a, a second face sheet 100b, one or more panel edge terminators 600, a three-dimensional ordered open-cellular micro-truss core 200 between the first face sheet 100a and the second face sheet 100b, a first connection (e.g., an adhesive) 500a between the core 200 and the first face sheet 100a, and a second connection (e.g., an adhesive) 500b between the core 200 and the second face sheet. A working fluid is filled within the ordered open-cellular micro-truss core 200, and the one or more panel edge terminators 600 are utilized to bond the first and second fact sheets 100a and 100b together.

In addition, as shown in FIG. 17a, the three-dimensional ordered open-cellular micro-truss core 200 is shown to include a vapor region at or in contact with the first face sheet 100a and a liquid region at or in contact with the second face sheet 100b. Here, the vapor region is for transporting a vapor phase portion of the working fluid from the higher temperature region to the lower temperature region, and the liquid region is for transporting a liquid phase portion of the working fluid from the lower temperature region to the higher temperature region.

Also, in one embodiment of the present invention and as shown in FIG. 17a, the sandwich panel heat pipe includes a mesh structure (e.g., a wire mesh) for separating the vapor region from the liquid region.

Referring to FIGS. 18a, 18b, 18c, and 18d, various sandwich panel heat pipes according to embodiments of the present invention are shown. More specifically, FIGS. 18a, 18b, 18c, and 18d are color pictures showing various generations (i.e., generations 0, 1, 2, and 3) of sandwich panel heat pipes that have been reduced to practice.

FIGS. 19a, 19b, 19c, and 19d schematically illustrate a test setup and data for determining heat transfer characteristics of an unsealed, non-functioning heat pipe, a heat pipe in initial stage of burnout, and an functioning heat pipe according to embodiments of the present inventions. Here, the functioning heat pipe is operated with a maximum heat flux of 4 W/cm$^2$ (or at about 4 W/cm$^2$) while the initial stage of burnout heat pipe is operated at a heat flux that is higher than 4 W/cm$^2$. As can be seen and/or derived from the graph shown in FIG. 19d, the functioning heat pipe, as compared to the unsealed, non-functioning heat pipe and the initial state of burnout heat pipe, has a much lower temperature difference between its higher temperature region at the heat source and the its lower temperature region at the cold sink, and has an effective thermal conductivity that is 1.9 times higher than a comparable solid copper block.

In view of the foregoing, a structural heat pipe according to an embodiment of the present invention is composed of two face sheets enclosing an ordered open-cellular micro-truss core and a working fluid where the micro-truss core is composed of two layers, one layer having a larger unit cell size than the other. Here, in the structural heat pipe, the core may have a three layer micro-truss structure with the outer layers having a smaller unit cell size than the inner layer. In one embodiment, a mesh is utilized to separate the two core layers. Alternatively, in another embodiment, the core is a single layer micro-truss with channels cut in it. Here, the relevant dimensions of the heat pipe may be derived from FIGS. 10a, 10b, 10c, 10d, 11, 12a, 12b, 12c, 12d, 13, 14a, 14b, 14c, and/or 14d.

In addition, embodiments of the present invention can be applicable for utilization by aerospace, auto, and other related industries as a method of designing structures with reduced weight which allows gains in range, payload, and/or efficiency and/or decreases in total system mass. Specific applications include:
  Combined electronics cooling and electronics structural support
  Combined human operator or passenger cooling and passenger structural support for aircraft and land-based vehicles
  Cooling of aircraft leading edges
  Cooling of fuel cells (e.g. for automotive applications)
  Passenger compartment cooling for automotive or aircraft applications (or water craft)

That is, currently heat pipe structures in commercial production are not designed or enhanced for structural performance as well as thermal performance, yielding structures which are not designed density, thermal performance, and structural performance as compared to the designs of the present invention as discussed above which are designed for multi-functionality. As such and in view of the foregoing, embodiments of the present are capable of enabling a heat spreading structure that can impart not only a thermal functional enhancement (via heat transport through the vapor) but also a structural function enhancement. The presence of the micro-truss material enables a mechanically efficient, lightweight structure that can be handled during manufacture, and can survive high-g shock during use in the application. Also, the micro-truss material is fabricated using a flexible method that enables conformability, and net-shape manufacture. Here, the heat pipes as designed can be tailored for a variety of applications.

In view of the foregoing, a heat pipe according to an embodiment of the present invention is lightweight and strong because the micro-truss is naturally lightweight and strong. In addition, the sandwich panel construction of the heat pipe improves flexural stiffness. Moreover, the heat pipe uses convection to yield effective thermal conductivity that is greater than solid metal (copper), is scalable in design, and is a passive heat transfer requiring no other energy input.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A method of forming a sandwich panel heat pipe for transferring heat between a higher temperature region and a lower temperature region, the method comprising:
  forming a three-dimensional ordered micro-truss core comprising a plurality of periodically disposed unit cells comprising an open-cellular microstructure and a free space defined by the open-cellular microstructure, the three-dimensional ordered micro-truss core comprising a vapor region and a liquid region separated by a mesh structure;
  forming a first face sheet and a second face sheet, wherein each of the first and second face sheets has a planar area larger than that of a corresponding planar area of the three-dimensional ordered micro-truss core facing each of the first and second face sheets;
  stacking the first face sheet, the three-dimensional ordered micro-truss core, and the second face sheet to form a heat pipe assembly, the mesh structure in the three-dimensional ordered micro-truss core being planar and substantially parallel to the first face sheet and the second face sheet;
  bonding the first and second face sheets along a perimeter of the heat pipe assembly to enclose the three-dimensional ordered micro-truss core;
  filling the free space of the three-dimensional ordered micro-truss core between the first and second face sheets with a working fluid through an inlet of the heat pipe assembly; and
  sealing the inlet.

2. The method of claim 1, wherein the forming of the three-dimensional ordered micro-truss core comprises:
  securing a volume of a photo-monomer;
  securing a mask between at least one collimated light source and the volume of the photo-monomer, the mask having a plurality of apertures;

directing a collimated light beam from the at least one collimated light source to the mask for a period of exposure time such that a portion of the collimated light beam passes through the mask and is guided by the plurality of apertures into the photo-monomer to form a plurality of waveguides through a portion of the volume of the photo-monomer; and removing any uncured photo-monomer to leave behind an open-cellular polymer micro-truss structure having a plurality of truss elements defined by the plurality of waveguides.

3. The method of claim 2, wherein the vapor region is formed to have a unit cell size larger than that of the liquid region.

4. The method of claim 1, wherein:
the liquid region is formed to include a first outer layer and a second outer layer, and
the vapor region is formed as an inner layer between the first outer layer and the second outer layer.

5. The method of claim 4, wherein the inner layer is formed to have a unit cell size larger than that of the first and second outer layer.

6. The method of claim 1, wherein in the forming of the three-dimensional ordered micro-truss core, the three-dimensional ordered micro-truss core is configurable in terms of a number of unit cells in the liquid region of the three-dimensional ordered micro-truss core, a unit cell base length of the three-dimensional ordered micro-truss core, an effective compressive modulus of the three-dimensional ordered micro-truss core, a compressive strength of the three-dimensional ordered micro-truss core, a strut radius of the three-dimensional ordered micro-truss core, a strut angle of the three-dimensional ordered micro-truss core, a maximum heat flux of the three-dimensional ordered micro-truss core, a density of the three-dimensional ordered micro-truss core, an effective thermal conductivity of the three-dimensional ordered micro-truss core, a bending stiffness of the three-dimensional ordered micro-truss core, and a bending strength of the three-dimensional ordered micro-truss core.

7. The method of claim 1, wherein the free space is not less than about 40% by volume of the micro-truss core.

* * * * *